(12) United States Patent
Hemnani et al.

(10) Patent No.: US 10,955,487 B2
(45) Date of Patent: Mar. 23, 2021

(54) HIGH VOLTAGE DIAGNOSTIC CONNECTOR WITH SERVICE DISCONNECT

(71) Applicant: TE CONNECTIVITY CORPORATION, Berwyn, PA (US)

(72) Inventors: Dinesh Loku Hemnani, Greensboro, NC (US); Jeremy Christin Patterson, Winston-Salem, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 127 days.

(21) Appl. No.: 16/352,971

(22) Filed: Mar. 14, 2019

(65) Prior Publication Data
US 2020/0292626 A1   Sep. 17, 2020

(51) Int. Cl.
| | |
|---|---|
| *G01R 31/392* | (2019.01) |
| *H01R 13/53* | (2006.01) |
| *H01R 13/66* | (2006.01) |
| *B60L 58/12* | (2019.01) |
| *B60L 58/18* | (2019.01) |
| *G01R 31/00* | (2006.01) |
| *B60L 3/00* | (2019.01) |

(52) U.S. Cl.
CPC .......... *G01R 31/392* (2019.01); *B60L 3/0046* (2013.01); *B60L 58/12* (2019.02); *B60L 58/18* (2019.02); *G01R 31/006* (2013.01); *H01R 13/53* (2013.01); *H01R 13/66* (2013.01); *B60L 2270/00* (2013.01)

(58) Field of Classification Search
CPC .... B60L 2270/00; B60L 3/0046; B60L 58/12; B60L 58/18; G01R 31/006; G01R 31/392; H01R 13/447; H01R 13/53; H01R 13/66; H01R 13/701; H01R 13/713; H01R 2201/20; H01R 2201/26; H01R 13/62938; H01R 13/62955; H01R 24/22; H01R 13/5205; H01R 13/7032; H01R 13/5221; H01R 13/707; Y02T 10/70; Y02T 10/7072; Y02T 90/14; H02J 7/0032

See application file for complete search history.

(56) References Cited

U.S. PATENT DOCUMENTS

| | | | | |
|---|---|---|---|---|
| 6,139,351 | A * | 10/2000 | Schaefer | B60L 3/0069 439/372 |
| 7,789,690 | B1 * | 9/2010 | Rhein | H01R 13/53 439/310 |
| 9,509,096 | B2 * | 11/2016 | Zhao | H01R 13/703 |
| 10,027,070 | B1 * | 7/2018 | Timmons | H01R 13/53 |
| 10,340,632 | B1 * | 7/2019 | Rangi | H01R 13/6275 |

* cited by examiner

*Primary Examiner* — Vinh P Nguyen

(57) ABSTRACT

A high voltage diagnostic connector includes a housing holding a positive terminal, a negative terminal and a ground terminal with a cover removably coupled to the housing. An HVIL assembly is in the housing having a HVIL contacts and an HVIL shunt. An HVIL switch is held by the housing including a shunt actuator operably coupled to the HVIL shunt to position the HVIL shunt in an un-shunted position to open an HVIL circuit when in the primary position and in a shunted position to close the HVIL circuit when in the secondary position. The shunt actuator is movable between the primary position and the secondary position when testing the positive terminal, the negative terminal and the ground terminal with the testing device during diagnostic testing of the high voltage diagnostic connector.

20 Claims, 16 Drawing Sheets

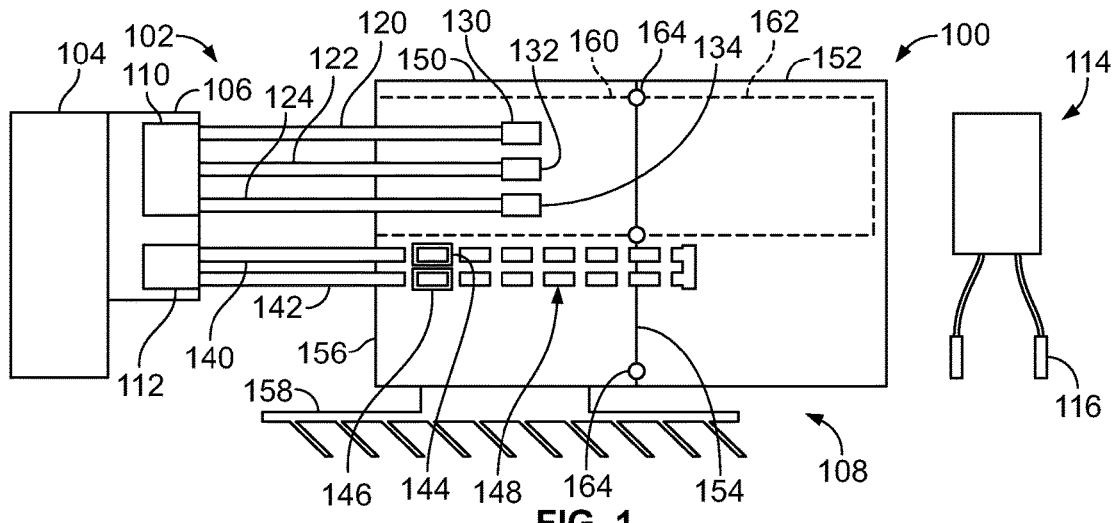
FIG. 1
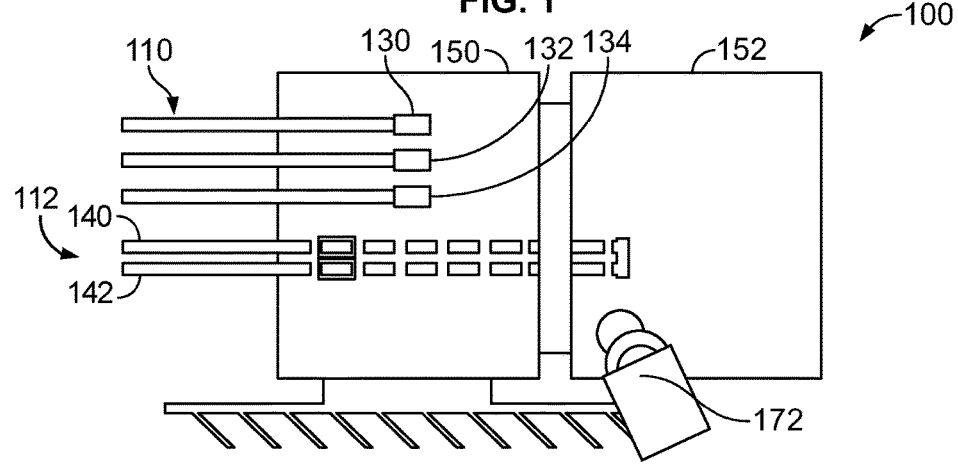
FIG. 3
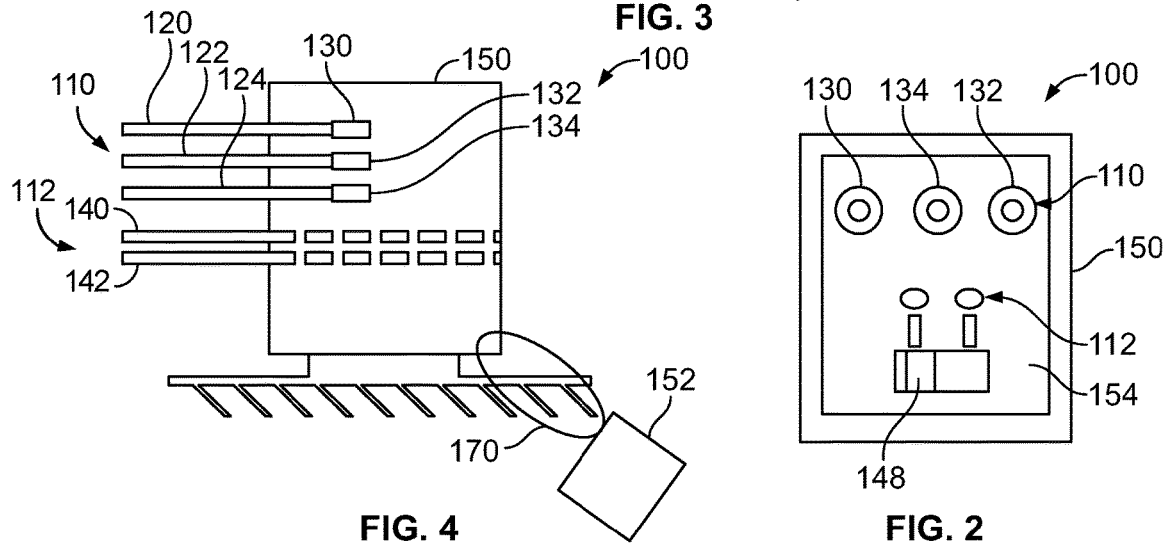
FIG. 4
FIG. 2

HIGH VOLTAGE DIAGNOSTIC CONNECTOR WITH SERVICE DISCONNECT

BACKGROUND OF THE INVENTION

The subject matter herein relates generally to a high voltage diagnostic connector for diagnostic inspection of battery system of a vehicle.

Vehicles, such as electric vehicles, include high voltage battery systems. There is a need to perform a diagnostic check of the voltage of the battery system, such as during service. Before service can be performed, a technician needs to ensure the high voltage from the battery has been isolated and the vehicle is safe to work on. To check the system voltage, the technician may need direct access to relays downstream from the battery to ensure power is disconnected and the high voltage battery is isolated. However, the high voltage batteries and their associated relays are typically in areas of the vehicle that are not readily accessible and thus performing a system voltage check is time consuming. Furthermore, it may be desirable to check the voltage of the battery system when the high voltage circuit is active for other troubleshooting purposes. However, typical battery system architectures provide a service disconnect having a high voltage interlock (HVIL) circuit that deactivates the system prior to allowing access to the batteries.

A need remains for a high voltage diagnostic connector at a remote, easily accessible access point that allows diagnostic inspection of the battery system.

BRIEF DESCRIPTION OF THE INVENTION

In one embodiment, a high voltage diagnostic connector for a battery system is provided including a housing holding a positive terminal, a negative terminal and a ground terminal forming part of a high voltage circuit of the battery system. The housing has a front and a rear and the positive terminal, the negative terminal and the ground terminal are accessed at the front for diagnostic testing of the high voltage circuit by a testing device. The high voltage diagnostic connector includes a cover removably coupled to the housing at the front to restrict and allow access to the positive terminal, the negative terminal and the ground terminal. The high voltage diagnostic connector includes an HVIL assembly in the housing having a first HVIL contact, a second HVIL contact and an HVIL shunt operable in a shunted position and an un-shunted position to close and open, respectively, an HVIL circuit of the battery system. The HVIL shunt electrically connects the first and second HVIL contacts in the shunted position and the first and second HVIL contacts being electrically isolated in the un-shunted position. The high voltage diagnostic connector includes an HVIL switch held by the housing including a shunt actuator movable between a primary position and a secondary position. The shunt actuator is operably coupled to the HVIL shunt. The shunt actuator positions the HVIL shunt in the un-shunted position to open the HVIL circuit when in the primary position and the shunt actuator positions the HVIL shunt in the shunted position to close the HVIL circuit when in the secondary position. The shunt actuator is movable between the primary position and the secondary position when testing the positive terminal, the negative terminal and the ground terminal with the testing device during diagnostic inspection of the high voltage battery system using the high voltage diagnostic connector.

In one embodiment, a high voltage diagnostic connector for a battery system is provided including a housing holding a positive terminal, a negative terminal and a ground terminal forming part of a high voltage circuit of the battery system. The housing has a front and a rear and the positive terminal, the negative terminal and the ground terminal are accessed at the front for diagnostic testing of the high voltage circuit by a testing device. The high voltage diagnostic connector includes a cover removably coupled to the housing at the front. The cover is positionable in a coupled position and an uncoupled position. The cover restricts access to the positive terminal, the negative terminal and the ground terminal when in the coupled position and the cover allows access to the positive terminal, the negative terminal and the ground terminal when in the uncoupled position. The high voltage diagnostic connector includes an HVIL assembly in the housing having a first HVIL contact, a second HVIL contact and an HVIL shunt operable in a shunted position and an un-shunted position to close and open, respectively, an HVIL circuit of the high voltage battery system. The HVIL shunt electrically connects the first and second HVIL contacts in the shunted position and the first and second HVIL contacts being electrically isolated in the un-shunted position. The high voltage diagnostic connector includes an HVIL switch held by the housing including a shunt actuator movable between a primary position and a secondary position. The shunt actuator is operably coupled to the HVIL shunt. The shunt actuator positions the HVIL shunt in the un-shunted position to open the HVIL circuit when in the primary position and the shunt actuator positions the HVIL shunt in the shunted position to close the HVIL circuit when in the secondary position. The shunt actuator is movable between the primary position and the secondary position when the cover is in the coupled position.

BRIEF DESCRIPTION OF THE DRAWINGS

FIG. 1 is a schematic illustration of a high voltage diagnostic connector in accordance with an exemplary embodiment.

FIG. 2 is a schematic illustration of a portion of the high voltage diagnostic connector shown in FIG. 1 in accordance with an exemplary embodiment.

FIG. 3 is a schematic illustration of the high voltage diagnostic connector shown in FIG. 1 in accordance with an exemplary embodiment.

FIG. 4 is a schematic illustration of the high voltage diagnostic connector shown in FIG. 1 in accordance with an exemplary embodiment.

DETAILED DESCRIPTION OF THE INVENTION

Figure 5:
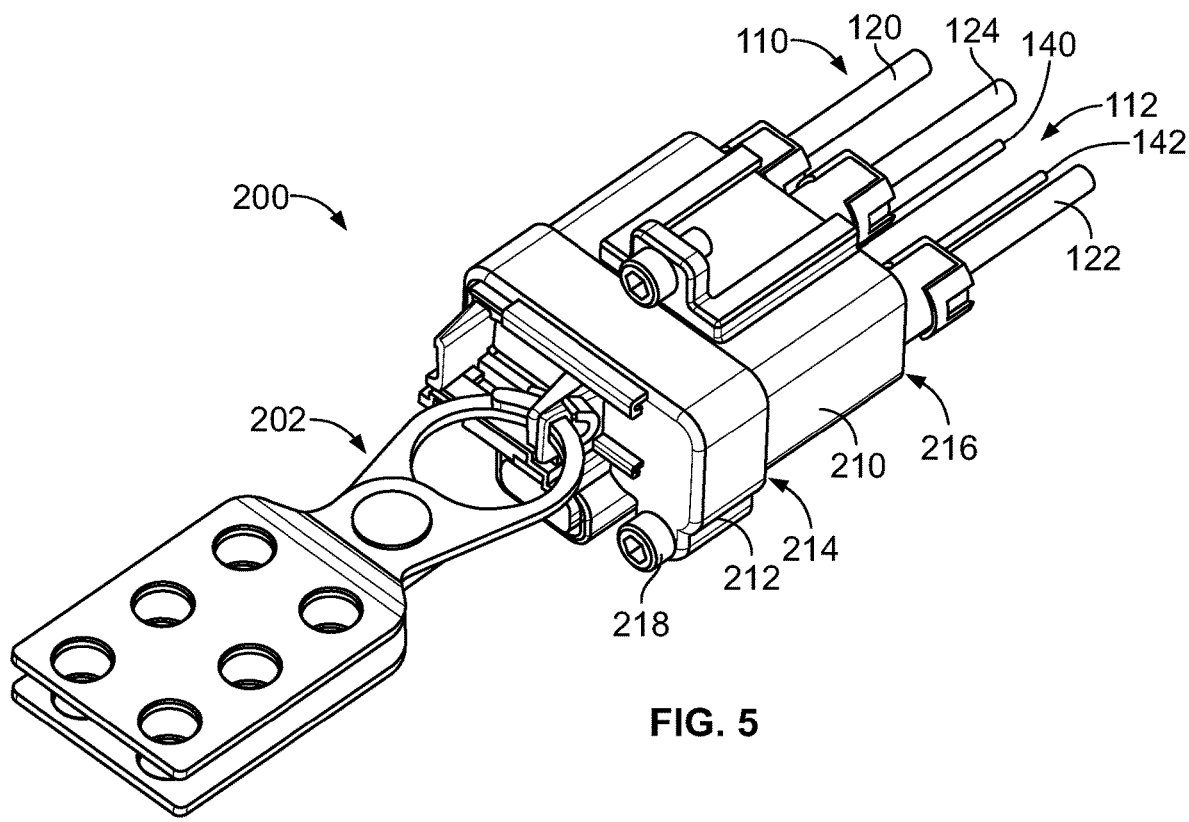
FIG. 5 is a front perspective view of the high voltage diagnostic connector shown in FIG. 1 in accordance with an exemplary embodiment.

FIG. 1 is a schematic illustration of a high voltage diagnostic connector 100 in accordance with an exemplary embodiment. In an exemplary embodiment, the high voltage diagnostic connector 100 is part of a battery system 102 of a vehicle, such as an electric vehicle. The high voltage diagnostic connector 100 is electrically connected to a battery 104 of the battery system 102, such as through a battery distribution unit 106. In an exemplary embodiment, the high voltage diagnostic connector 100 is located at a remote access point 108 remote from the battery 104 for diagnostic inspection of the battery system—102.

In an exemplary embodiment, the battery system 102 includes a high voltage circuit 110 and a high voltage interlock (HVIL) circuit 112. The high voltage circuit 110 is used for operating the vehicle, such as for operating a motor of the vehicle. The HVIL circuit 112 is a low voltage circuit that protects a technician against unintended access to high voltage components of the battery system. The HVIL circuit 112 is used for activating and deactivating the high voltage circuit 110. For example, when the HVIL circuit 112 is open, the high voltage circuit 110 is deactivated to shut down the motor or other parts of the vehicle. When the HVIL circuit 112 is closed, the high voltage circuit 110 is activated to operate the motor or other parts of the vehicle. There may be times where it may be desirable to deactivate the high voltage circuit 110, such as prior to sale of the vehicle during transport or when the vehicle is on the sales lot. When servicing the vehicle, the technician deactivates the high voltage circuit 110 to avoid injury to the service technician. However, when diagnostic testing the vehicle, it may be desirable to activate the high voltage circuit 110, such as to determine the voltage or other operating characteristic of the battery 104 or other components of the battery system 102. The high voltage diagnostic connector 100 provides a convenient and safe access point for diagnostic testing of the battery system 102, which may be remote from the battery 104, using a diagnostic testing device 114. The diagnostic testing device 114 includes testing probes 116 that may be electrically connected to the high voltage diagnostic connector 100 during the diagnostic testing process. The high voltage diagnostic connector 100 may be used to activate and deactivate the high voltage circuit 110 by providing a device for opening and closing the HVIL circuit 112.

In an exemplary embodiment, the battery system 102 includes a positive cable 120, a negative cable 122 and the ground cable 124. The positive cable 120, the negative cable 122 and the ground cable 124 may be coupled to the battery 104 or other parts of the battery system 102. The high voltage diagnostic connector 100 includes a positive terminal 130 terminated to the positive cable 120, a negative terminal 132 terminated to the negative cable 122, and the ground terminal 134 terminated to the ground cable 124. In an exemplary embodiment, the testing probes 116 of the diagnostic testing device 114 may be electrically connected to the positive terminal 130, the negative terminal 132 or the ground terminal 134 during the diagnostic testing process.

In an exemplary embodiment, the battery system 102 includes a first HVIL cable 140 and a second HVIL cable 142. The HVIL cables 140, 142 may be coupled to the battery 104 or other parts of the battery system 102, such as the battery distribution unit 106. The high voltage diagnostic connector 100 includes a first HVIL contact 144 and a second HVIL contact 146 electrically connected to the corresponding HVIL cables 140, 142. In an exemplary embodiment, the high voltage diagnostic connector 100 includes an HVIL switch 148 that is used to open and close the HVIL circuit 112.

The high voltage diagnostic connector 100 includes a housing 150 and a cover 152 removably coupled to the housing 150. The housing 150 extends between a front 154 and a rear 156 and the cover 152 is coupled to the front 154. The housing 150 holds the terminals 130, 132, 134 and the HVIL contacts 144, 146. When the cover 152 is removed, the terminals 130, 132, 134 are accessible at the front 154 for diagnostic testing of the high voltage circuit 110 by the diagnostic testing device 114. When the cover 152 is coupled to the housing 150, the terminals 130, 132, 134 are inaccessible. In an exemplary embodiment, the housing 150 may be mounted to a structure 158 of the vehicle at the access point 108, which may be remote from the battery 104 and the battery distribution unit 106. The cables 120, 122, 124 are routed between the housing 150 and the battery 104 and/or the battery distribution unit 106.

In an exemplary embodiment, the high voltage diagnostic connector 100 includes a shield 160 in the housing 150 and a shield 162 in the cover 152. The shields 160, 162 provide electrical shielding for the terminals 130, 132, 134. The shields 160, 162 may provide electrical shielding for the HVIL contacts 144, 146. In an exemplary embodiment, the high voltage diagnostic connector 100 includes a seal 164 between the housing 150 and the cover 152. The seal 164 may be a gasket or other type of environmental seal. The high voltage diagnostic connector 100 may include seals for the cables 120, 122, 124 and/or the cables 140, 142.

FIG. 2 is a schematic illustration of a portion of the high voltage diagnostic connector 100 in accordance with an exemplary embodiment. FIG. 2 shows the front 154 of the housing 150 (with the cover 152 removed), illustrating the positive terminal 130, the negative terminal 132 and the ground terminal 134. FIG. 2 shows the HVIL switch 148. The terminals 130, 132, 134 are accessible at the front 154 for testing by the testing probes 116 of the diagnostic testing device 114 (shown in FIG. 1). The testing probes 116 may be pins and the terminals 130, 132, 134 may be sockets. Other types of terminals and probes may be used in alternative embodiments.

The HVIL switch 148 is operable to open and close the HVIL circuit 112. In the illustrated embodiment, the HVIL switch 148 is a toggle switch that may be moved between a primary position and a secondary position. In the primary position, the HVIL circuit 112 may be open and in the secondary position, the HVIL circuit 112 may be closed. In an exemplary embodiment, the HVIL switch 148 may be manually actuated between the primary position and the secondary position. Optionally, the HVIL switch 148 may be automatically returned to the primary position when released. For example, a biasing member, such as a spring may be used to bias the HVIL switch 148 to the primary position. The HVIL switch 148 may be a slider, a push button, a knob, a dial, and the like configured to be moved between one or more positions to open and close the HVIL circuit 112.

FIG. 3 is a schematic illustration of the high voltage diagnostic connector 100 in accordance with an exemplary embodiment. FIG. 4 is a schematic illustration of the high voltage diagnostic connector 100 in accordance with an exemplary embodiment. FIG. 3 shows the cover 152 in an intermediate or a staged position, wherein the cover 152 is partially mated to or partially unmated from the housing 150. FIG. 4 shows the cover 152 uncoupled from the housing 150. Optionally, a tether 170 may be coupled between the cover 152 and housing 150 to tether the cover 152 to the housing 150 when the cover 152 is removed from the housing 150.

In an exemplary embodiment, the HVIL circuit 112 may be open when the cover 152 is in the staged position. As such, the high voltage circuit 110 may be open or deactivated when the cover 152 is partially uncoupled from the housing 150 in the staged position. In an exemplary embodiment, the high voltage diagnostic connector 100 includes a lockout device 172 used to hold the cover 152 in the staged position and to prevent the cover 152 from moving to the coupled or closed position (FIG. 1). The lockout device 172 may include a lever, a clip, a latch, a zip tie, or another type of device used to retain the cover 152 in the staged position. In an exemplary embodiment, the cover 152 is restricted from closing until the lockout device 172 is removed or manually moved to a clearance position. Optionally, the cover 152 may be restricted from being removed from the housing 150 until the lockout device 172 is removed or move to a clearance position. When the cover 152 is uncoupled from the housing 150 the terminals 130, 132, 134 (shown in FIG. 2) are accessible for diagnostic testing by the diagnostic testing device 114 (shown in FIG. 1).

Figure 6:
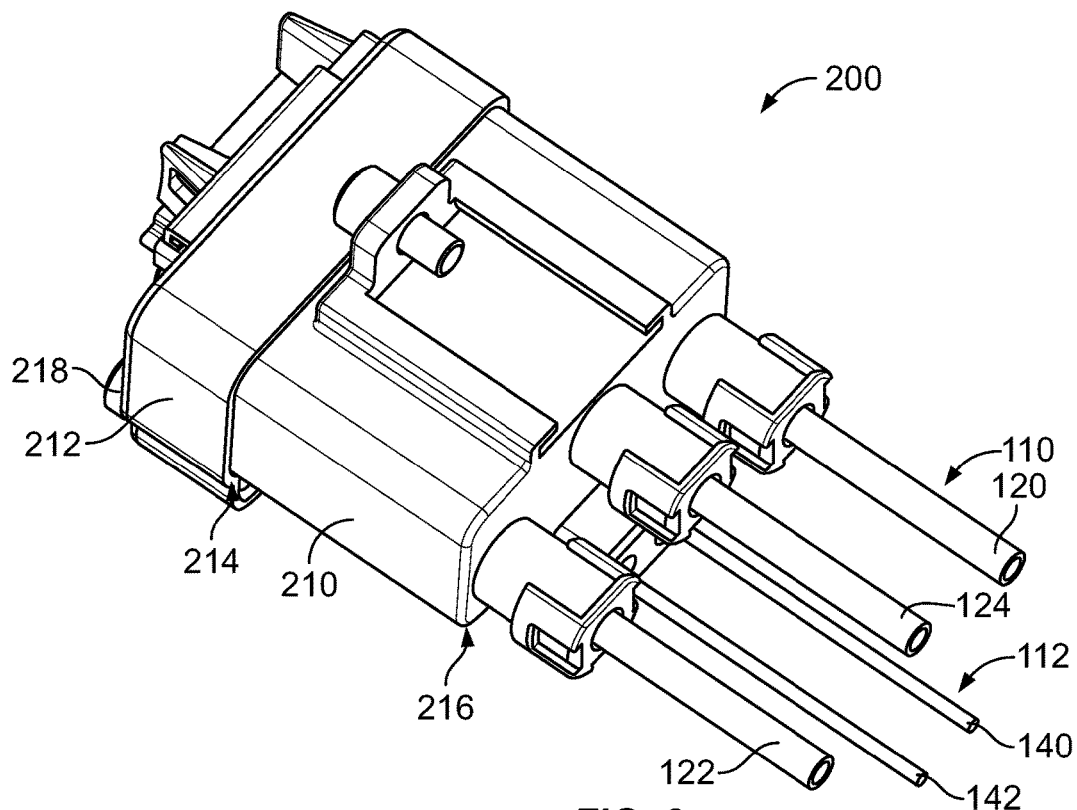
FIG. 6 is a rear perspective view of the high voltage diagnostic connector shown in FIG. 5 in accordance with an exemplary embodiment.
Figure 7:
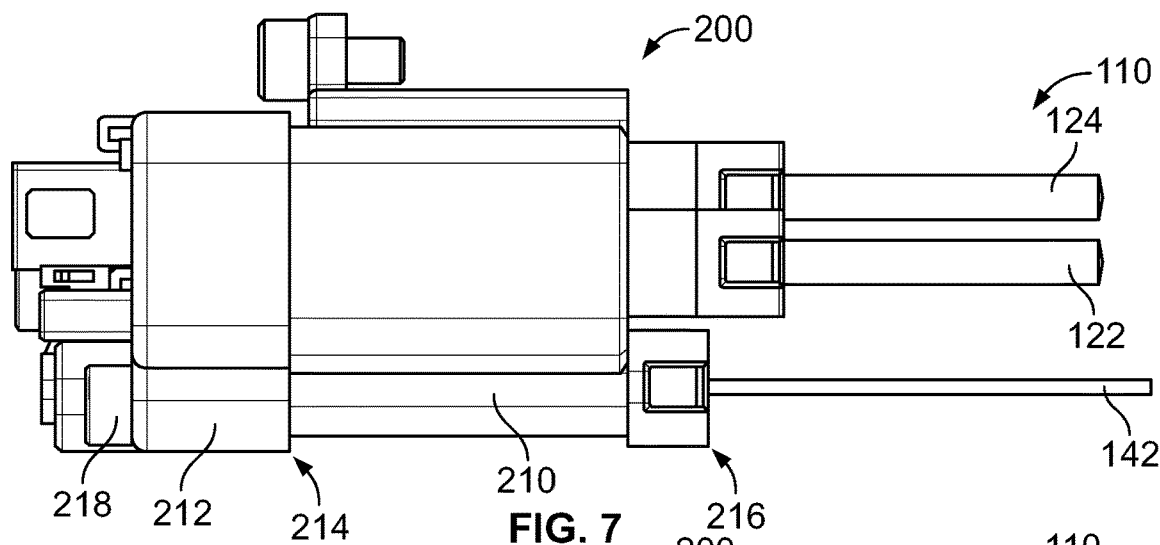
FIG. 7 is a side view of the high voltage diagnostic connector shown in FIG. 5 in accordance with an exemplary embodiment.
Figure 8:
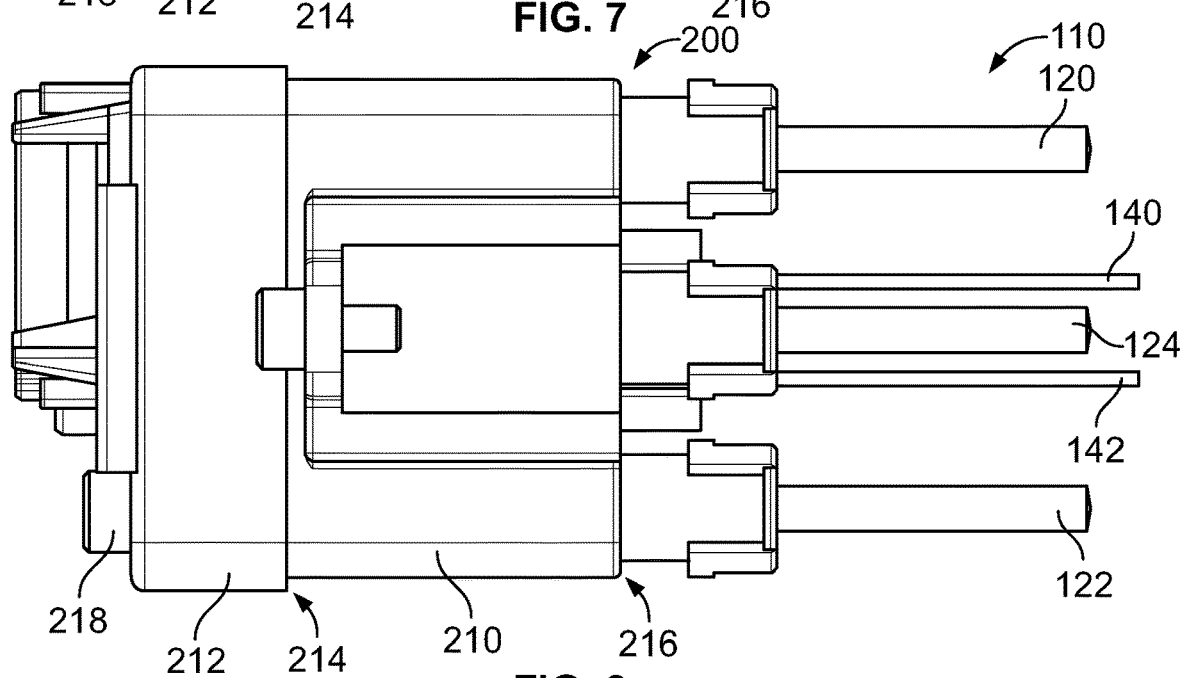
FIG. 8 is a top view of the high voltage diagnostic connector shown in FIG. 5 in accordance with an exemplary embodiment.
Figure 9:
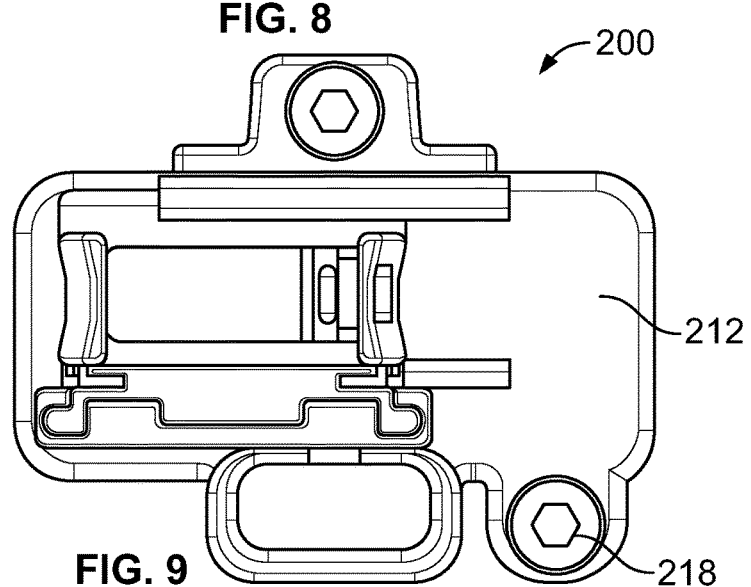
FIG. 9 is a front view of the high voltage diagnostic connector shown in FIG. 5 in accordance with an exemplary embodiment.

FIG. 5 is a front perspective view of a high voltage diagnostic connector 200 in accordance with an exemplary embodiment. FIG. 5 illustrates a lockout device 202 coupled to the high voltage diagnostic connector 200. FIG. 6 is a rear perspective view of the high voltage diagnostic connector 200 in accordance with an exemplary embodiment. FIG. 7 is a side view of the high voltage diagnostic connector 200 in accordance with an exemplary embodiment. FIG. 8 is a top view of the high voltage diagnostic connector 200 in accordance with an exemplary embodiment. FIG. 9 is a front view of the high voltage diagnostic connector 200 in accordance with an exemplary embodiment.

The high voltage diagnostic connector 200 is an exemplary implementation of the high voltage diagnostic connector 100 schematically illustrated in FIG. 1. The high voltage diagnostic connector 200 is usable within the battery system 102 (shown in FIG. 1). FIG. 5 illustrates the positive cable 120, the negative cable 122 and the ground cable 124 extending therefrom. FIG. 5 illustrates the first and second HVIL cables 140, 142 extending therefrom.

The high voltage diagnostic connector 200 includes a housing 210 and a cover 212 removably coupled to the housing 210. The housing 210 extends between a front 214 and a rear 216 and the cover 212 is coupled to the front 214. The cover 212 is removable from the housing 210 to access terminals of the high voltage diagnostic connector 200 for diagnostic testing of the high voltage circuit 110. In an exemplary embodiment, a fastener 218 is used to secure the cover 212 to the housing 210. Other types of securing devices, such as latches, clips and the like may be used to secure the cover 212 to the housing 210.

Figures 10, 11:
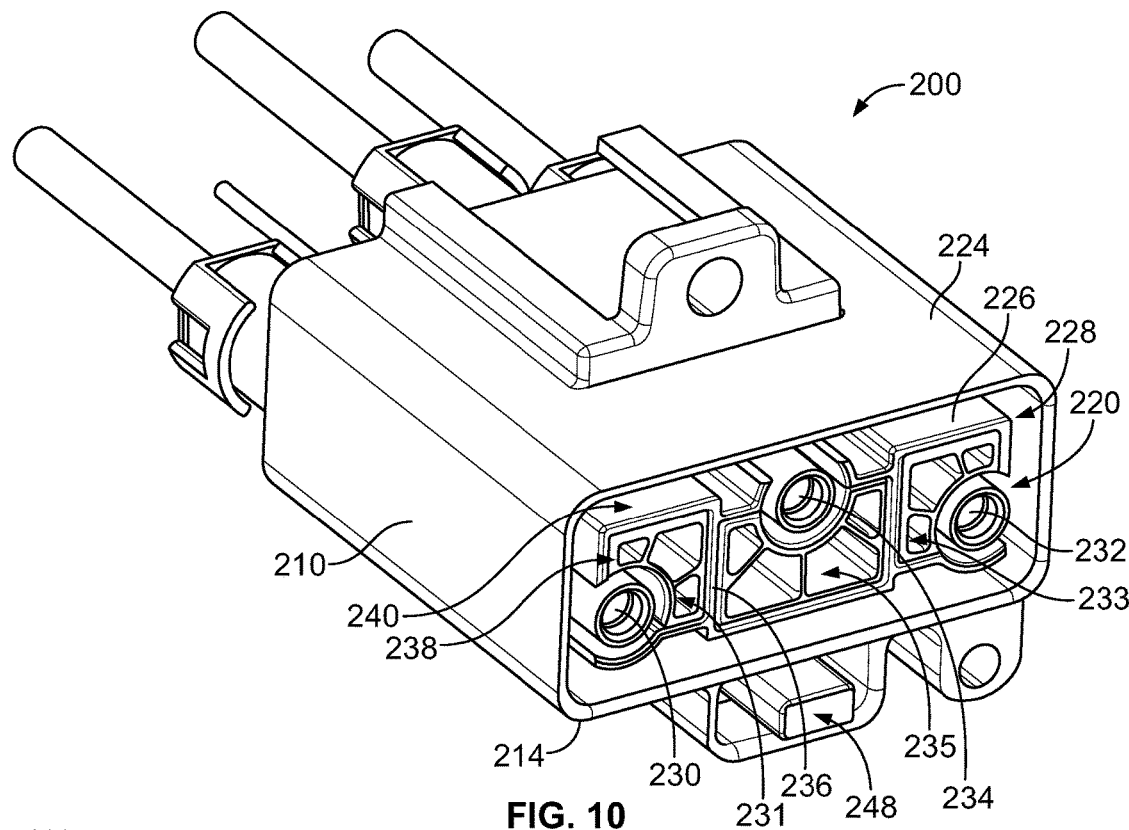
FIG. 10 is a front perspective view of a portion of the high voltage diagnostic connector shown in FIG. 5 in accordance with an exemplary embodiment.
FIG. 11 is a partial sectional view of the high voltage diagnostic connector shown in FIG. 5 in accordance with an exemplary embodiment.

FIG. 10 is a front perspective view of a portion of the high voltage diagnostic connector 200 (with the cover 212 removed) in accordance with an exemplary embodiment. FIG. 10 shows the housing 210 holding a high voltage terminal assembly 220 and an HVIL assembly 222. In an exemplary embodiment, the housing 210 includes an outer shell 224 and an inner housing 226 received in a cavity 228 of the outer shell 224. The inner housing 226 supports the high voltage terminal assembly 220.

The high voltage terminal assembly 220 includes a positive terminal 230, a negative terminal 232 and a ground terminal 234. In an exemplary embodiment, the inner housing 226 includes separator walls 236 forming terminal cavities 238. The terminals 230, 232, 234 are received in corresponding terminal cavities 238. The separator walls 236 separate the terminals 230, 232, 234 from each other. In an exemplary embodiment, the high voltage terminal assembly 220 includes terminal holders holding each of the terminals 230, 232, 234. For example, a first terminal holder 231 holds the positive terminal 230, a second terminal holder 233 holds the negative terminal 232 and a third terminal holder 235 holds the ground terminal 234. In other various embodiments, the inner housing 226 may directly hold the terminals 230, 232, 234 without the need for the separate terminal holders 231, 233, 235.

In an exemplary embodiment, the housing 210 includes a shield 240 providing electrical shielding for the terminals 230, 232, 234. In the illustrated embodiment, the inner housing 226 includes the shield 240. For example, the inner housing 226 and/or outer shell 224 may be conductive and form the shield 240. The terminal holders 231, 233, 235 may be dielectric to electrically isolate the terminals 230, 232, 234 from the inner housing 226 and/or outer shell 224. The inner housing 226 and/or outer shell 224 may be a plated plastic component. Alternatively, the inner housing 226 and/or outer shell 224 may be die cast. In other various embodiments, the inner housing 226 and/or outer shell 224 may be manufactured from a metal material or may be a metallized plastic material. In other various embodiments, the inner housing 226 may be nonconductive and the shield 240 may be a separate component coupled to the inner housing 226. For example, the shield 240 may be a stamped and formed part coupled to and surrounding the inner housing 226. In other various embodiments, the outer shell 224 may include the shield 240 rather than the inner housing 226. In other various embodiments, the shield 240 may be sandwiched between the outer shell 224 and the inner housing 226.

The HVIL assembly 222 includes an HVIL switch 248 used to open and close the HVIL circuit 112. The HVIL switch 248 is accessible at the front 214 and may be actuated between a primary position and a secondary position to close and open the HVIL circuit 112, respectively.

Figure 12:
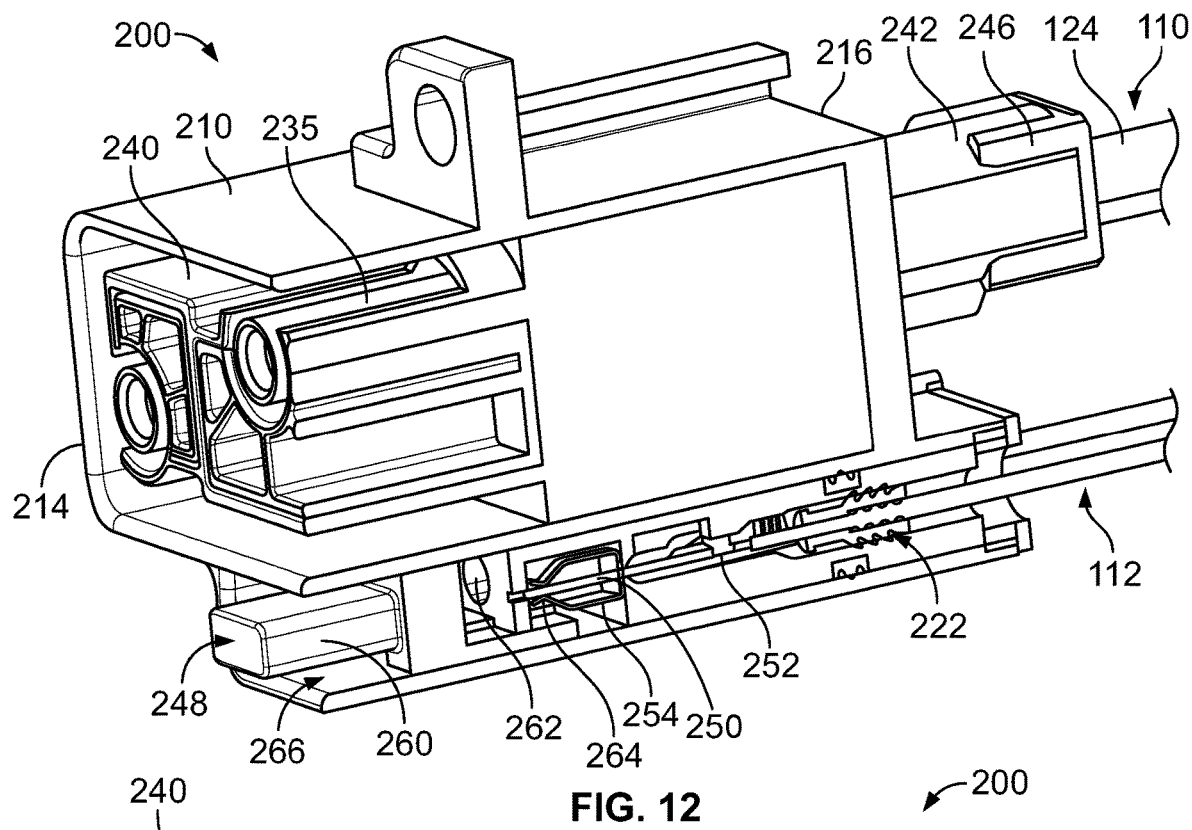
FIG. 12 is a partial sectional view of the high voltage diagnostic connector shown in FIG. 5 in accordance with an exemplary embodiment.
Figure 13:
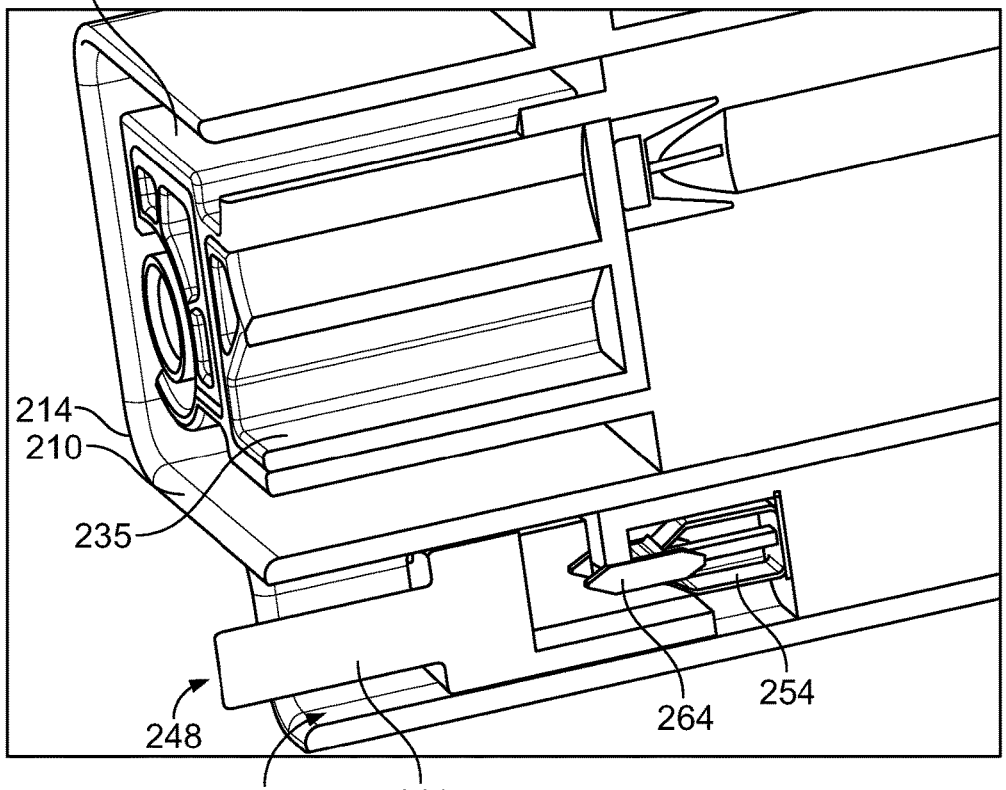
FIG. 13 is a partial sectional view of a portion of the high voltage diagnostic connector shown in FIG. 5 in accordance with an exemplary embodiment.

FIG. 11 is a partial sectional view of the high voltage diagnostic connector 200 in accordance with an exemplary embodiment. FIG. 12 is a partial sectional view of the high voltage diagnostic connector 200 in accordance with an exemplary embodiment. FIG. 13 is a partial sectional view of a portion of the high voltage diagnostic connector 200 in accordance with an exemplary embodiment.

As shown in FIG. 11, the ground terminal 234 is held in the corresponding terminal holder 235. The ground cable 124 is configured to be terminated to the ground terminal 234. For example, the ground terminal 234 may be crimped, soldered, or otherwise terminated to the end of the ground cable 124. In an exemplary embodiment, the housing 210 includes a cable barrel 242 extending from the rear 216. The ground cable 124 extends through the cable barrel 242. In an exemplary embodiment, a cable seal 244 seals the ground cable 124 in the cable barrel 242. A barrel cap 246 may be provided at the end of the cable barrel 242 to hold the cable seal 244 and the ground cable 124 in the cable barrel 242. Optionally, a cable shield of the ground cable 124 may be electrically connected to the shield 240.

The HVIL assembly 222 includes the HVIL switch 248, HVIL contacts 250 (FIG. 12) and an HVIL shunt 254 used to electrically connect the HVIL contacts 250 by a shunted connection. The HVIL switch 248 is used to operate the HVIL shunt 254 in an un-shunted position and a shunted position to open and close the HVIL circuit 112. The HVIL shunt 254 electrically connects the HVIL contacts 250 in the shunted position. The HVIL contacts 250 are electrically isolated when the HVIL shunt 254 is in the un-shunted position. Optionally, the HVIL shunt 254 may be moved, such as forward and rearward, side to side, up and down, or along other movement paths, when the HVIL switch 248 is operated. The HVIL shunt 254 may be moved into contact with, and out of contact with, the HVIL contacts 250 as the HVIL shunt 254 is moved between the un-shunted position and the shunted position. In other various embodiments, the HVIL switch 248 may move one or both of the HVIL contacts 250 relative to each other and/or relative to the HVIL shunt 254 during operation to open and close the HVIL circuit 112.

In an exemplary embodiment, the HVIL switch 248 includes an HVIL switch actuator 260, a biasing member 262 (FIG. 11) operably coupled to the HVIL switch actuator 260, and a shunt actuator 264 (FIG. 13). The shunt actuator 264 is coupled to the HVIL switch actuator 260. In an exemplary embodiment, the housing 210 includes a chamber 266 that receives the HVIL switch 248. For example, the HVIL switch actuator 260, the biasing member 262 and the shunt actuator 264 are located in the chamber 266. The chamber 266 may confine movement of the HVIL switch actuator 260 during actuation thereof.

The HVIL switch actuator 260 is operated to move the shunt actuator 264. For example, the HVIL switch actuator 260 is accessible at the front 214 and configured to be manually actuated. In the illustrated embodiment, the HVIL switch actuator 260 is a push button that may be moved from an un-actuated position to an actuated position. For example, the biasing member 262 may engage the HVIL switch actuator 260 and hold the HVIL switch actuator 260 in an extended position. The technician may press the HVIL switch actuator 260 inward to a depressed position (actuated position). The linear, rearward movement of the HVIL switch actuator 260 causes the shunt actuator 264 to move, such as between corresponding un-actuated and actuated positions. When the HVIL switch actuator 260 is released, the biasing member 262 causes the HVIL switch actuator 260 to return to the extended position (un-actuated position), which causes the shunt actuator 264 to similarly returned to an un-actuated position. Other types of actuators may be used in alternative embodiments having other types of movement other than linear forward and rearward movement. For example, the HVIL switch actuator 260 may be a slider configured to slide side to side or up and down. The HVIL switch actuator 260 may be pivoted, rather than having sliding, linear movement. Other types of actuators may be used in alternative embodiments.

As shown in FIG. 13, as an exemplary embodiment, the shunt actuator 264 is configured to be coupled to the HVIL shunt 254 to move the HVIL shunt 254 between the un-shunted position and the shunted position. FIG. 13 shows the HVIL shunt 254 in the un-shunted position disengaging the first HVIL contact 250. The HVIL shunt 254 creates an electrical path between the HVIL contacts 250. The shunt actuator 264 is moved to the actuated position by the HVIL switch actuator 260. For example, when the technician pushes the HVIL switch actuator 260, the shunt actuator 264 is moved to the actuated position. The shunt actuator 264 moves the HVIL shunt 254 to the shunted position. The HVIL circuit 112 is closed in the shunted position, thus activating the high voltage circuit 110. It may be desirable for the technician to activate the high voltage circuit 110 during the diagnostic testing process, such as when the diagnostic testing device 114 is coupled to the high voltage diagnostic connector 200.

When the HVIL switch actuator 260 is released, the HVIL switch actuator 260 returns to the un-actuated position and the shunt actuator 264 is moved to the un-actuated position with the HVIL switch actuator 260. In the un-actuated position, the shunt actuator 264 allows the HVIL shunt 254 to return to the un-shunted position. For example, the HVIL shunt 254 moves away from the HVIL contacts 250 such that the HVIL contacts 250 are no longer electrically connected together. The HVIL circuit 112 is open in the un-shunted position, thus deactivating the high voltage circuit 110.

Figure 14:
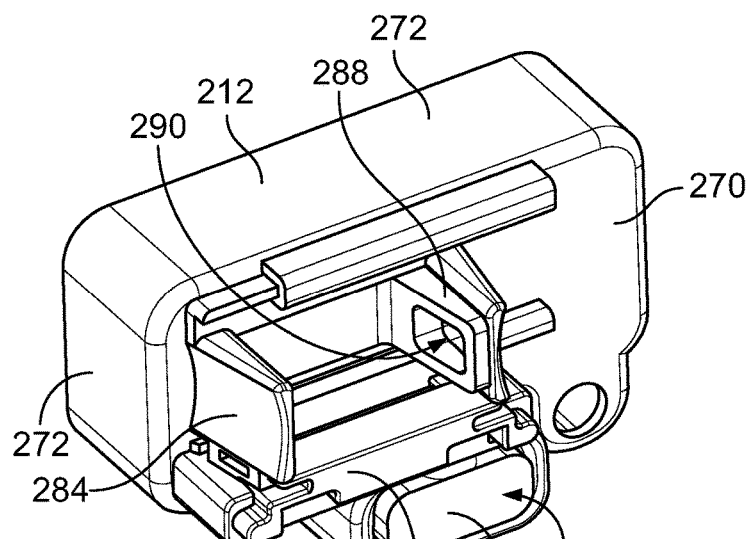
FIG. 14 is a front perspective view of a cover of the high voltage diagnostic connector shown in FIG. 5 in accordance with an exemplary embodiment.
Figure 15:
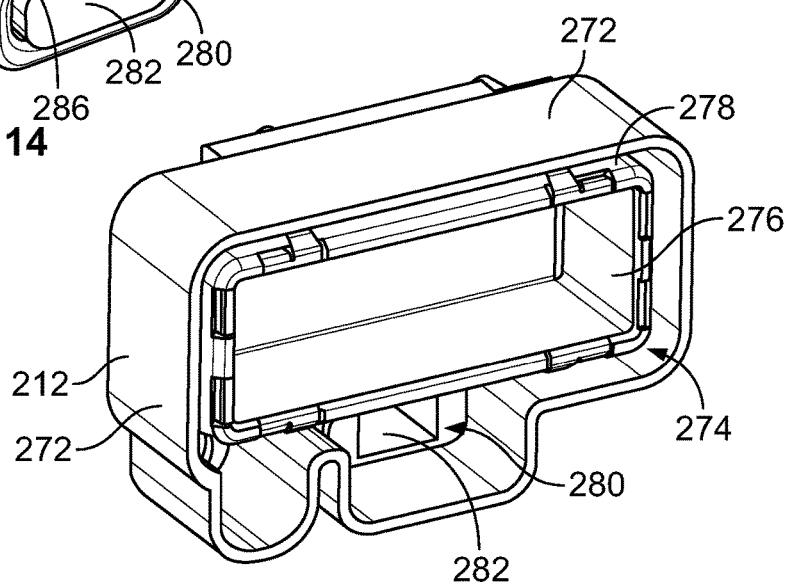
FIG. 15 is a rear perspective view of the cover shown in FIG. 14 in accordance with an exemplary embodiment.

FIG. 14 is a front perspective view of the cover 212 in accordance with an exemplary embodiment. FIG. 15 is a rear perspective view of the cover 212 in accordance with an exemplary embodiment. The cover 212 includes a front wall 270 and sidewalls 272 defining a cavity 274. In an exemplary embodiment, the cavity 274 has a shield 276 for providing electrical shielding within the cover 212, such as for shielding the terminals 230, 232, 234 (shown in FIG. 10). In an exemplary embodiment, the cover 212 includes a seal 278 configured to be sealed to the housing 210 when coupled thereto.

The cover 212 includes a cover actuator 280 configured to be operably coupled to the HVIL switch 248 (shown in FIG. 11). The cover actuator 280 allows actuation of the HVIL switch 248 from the exterior of the cover 212. In an exemplary embodiment, the cover actuator 280 is movable between an un-actuated position and an actuated position. In the actuated position, the cover actuator 280 engages and actuates the HVIL switch 248, which closes the HVIL circuit 112 to activate the high voltage circuit 110. In the un-actuated position, the cover actuator 280 is positioned such that the cover actuator 280 does not actuate the HVIL switch 248. In various embodiments, the cover actuator 280 is disengaged from the HVIL switch 248 in the un-actuated position. In other various embodiments, the cover actuator 280 may engage the HVIL switch 248, but does not actuate the HVIL switch 248. As such, with the cover 212 attached to the housing 210, the high voltage diagnostic connector 200 may activate or deactivate the high voltage circuit 110 by closing or opening the HVIL circuit 112 using the cover actuator 280.

In the illustrated embodiment, the cover actuator 280 includes an actuator button 282, a slider 284 and a latch 286. The cover actuator 280 is movable relative to the cover 212 to engage and disengage the HVIL switch 248. The slider 284 is operably coupled to the actuator button 282 to move the actuator button 282 between an extended position and a depressed position. For example, the slider 284 and/or the actuator button 282 may include a cam used to transfer sliding movement of the slider 284 to pressing movement of the actuator button 282. For example, the slider 284 may include a ramp that engages the actuator button 282 and forces the actuator button 282 rearward as the slider 284 is moved sideways along the front wall 270. The latch 286 is used to hold the slider 284 in the un-actuated position to prevent inadvertent actuation of the cover actuator 280. In the illustrated embodiment, the latch 286 is a push button; however, other types of latches may be used in alternative embodiments. When the latch 286 is pressed inward, the slider 284 is released and allowed to be actuated to—pull the actuator button 282—outward. Optionally, the slider 284 may be automatically return to the un-actuated position, such as by a biasing member. Alternatively, the slider 284 may be manually returned to the un-actuated position.

In an exemplary embodiment, the cover 212 includes a locating tab 288 extending from the front wall 270. The slider 284 may engage the locating tab 288 to position the slider 284 along the front wall 270. In the illustrated embodiment (FIG. 14), the slider 284 engages the locating tab 288 in the un-actuated position and engages the locating tab 288—in the actuated position. In other various embodiments, multiple locating tabs may be provided. In the illustrated embodiment, the locating tab 288 includes an opening 290 that receives the lockout device 202 (FIG. 5). The lockout device 202 may be clipped to the slider 284 and the locating tab 288 to hold the slider 284 in the actuated position and to prevent the cover actuator 280 from moving to the actuated position. The slider 284 is restricted from moving to the un-actuated position until the lockout device 172 is removed or manually moved to a clearance position. In another embodiment, the lockout device 202 may also be installed directly on the latch 286 to prevent the latch 286 from being pressed inward, which would also prevent the slider 284 from being released and actuated.

Figure 16:
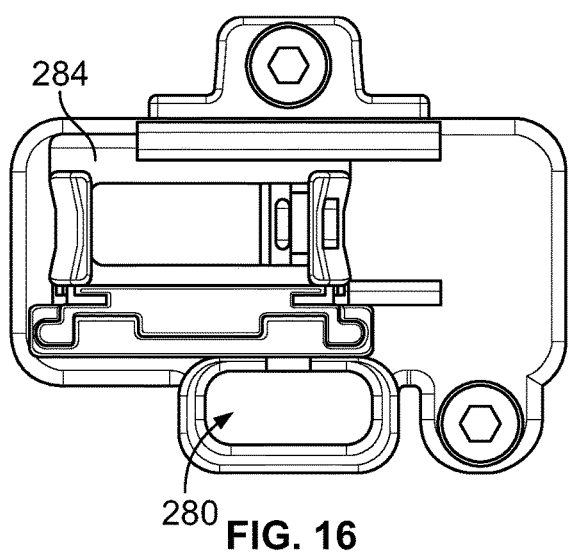
FIG. 16 is a front view of the high voltage diagnostic connector shown in FIG. 5 in accordance with an exemplary embodiment.
Figure 17:
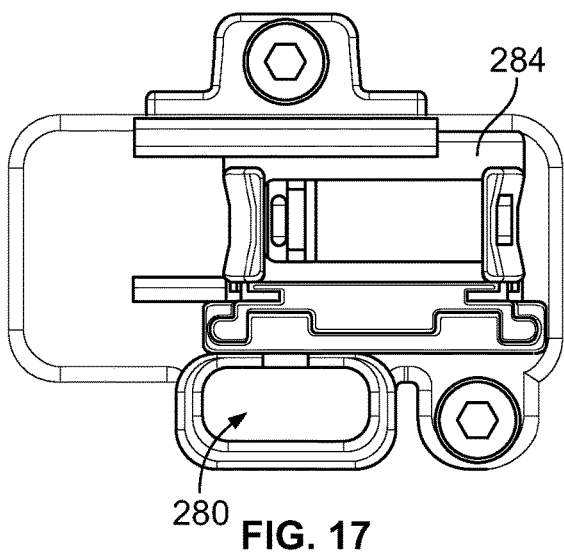
FIG. 17 is a front view of the high voltage diagnostic connector shown in FIG. 5 in accordance with an exemplary embodiment.

FIG. 16 is a front view of the high voltage diagnostic connector 200 showing the cover actuator 280 in an un-actuated position. FIG. 17 is a front view of the high voltage diagnostic connector 200 showing the cover actuator 280 in an actuated position. The slider 284 is slid from left to right to move from the un-actuated position to the actuated position.

Figure 18:
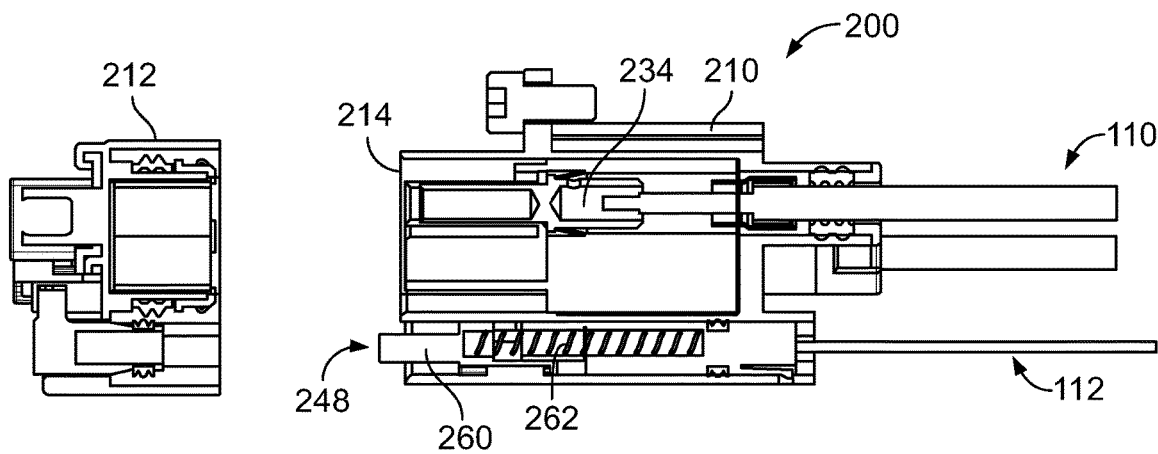
FIG. 18 is a cross-sectional view of the high voltage diagnostic connector shown in FIG. 5 in accordance with an exemplary embodiment.

FIG. 18 is a cross-sectional view of the high voltage diagnostic connector 200 showing the cover 212 uncoupled from the housing 210. When the cover 212 is removed from the housing 210, the HVIL switch 248 is extended or un-actuated. For example, the biasing member 262 forces the HVIL switch actuator 260 forward to the un-actuated position. In the un-actuated position, the HVIL shunt 254 is in the un-shunted position, and thus the HVIL circuit 112 is open and the high voltage circuit 110 is inactive. As such, the terminals 230, 232, 234 are dead and there is no risk of electrical shock to the technician.

When the cover 212 is removed, the terminals 230, 232, 234 are exposed at the front 214 for diagnostic testing. The technician may connect the diagnostic testing device 114 to the terminals 230, 232, 234. When the cover 212 is uncoupled, the HVIL switch actuator 260 is exposed at the front 214 for manual activation by the technician. Once the diagnostic testing device 114 (FIG. 1) is coupled to the terminals 230, 232, 234, the technician may actuate the HVIL switch actuator 260 by pressing inward on the HVIL switch actuator 260. The HVIL shunt 254 may be electrically connected to the HVIL contacts 250 to close the HVIL circuit 112 and activate the high voltage circuit 110 for testing of the high voltage circuit 110. The technician may then release the HVIL switch actuator 260 to again open the HVIL circuit 112 and deactivate the high voltage circuit 110. Once testing is complete, the cover 212 may be re-coupled to the housing 210.

Figure 19:
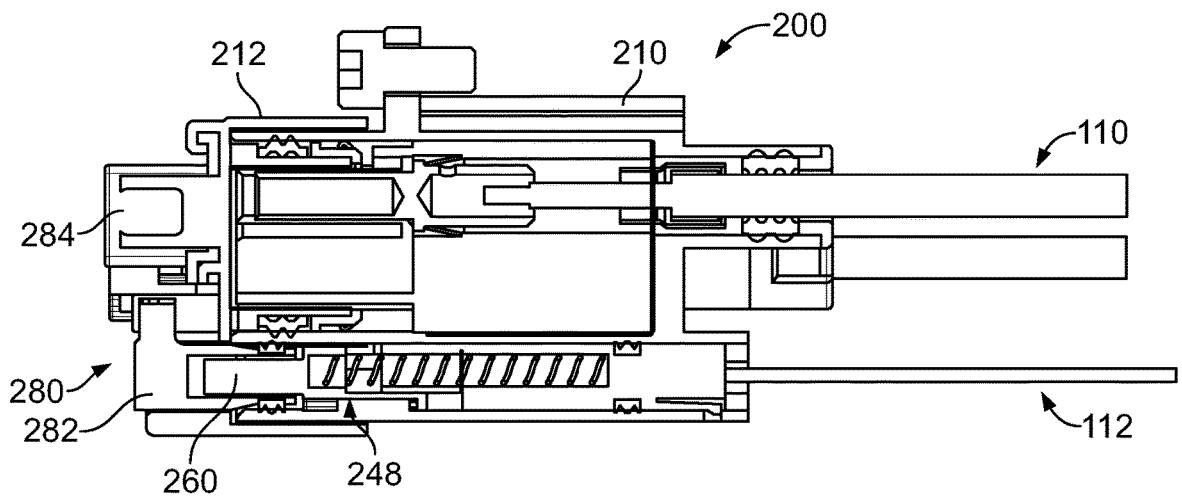
FIG. 19 is a cross-sectional view of the high voltage diagnostic connector shown in FIG. 5 in accordance with an exemplary embodiment.
Figure 20:
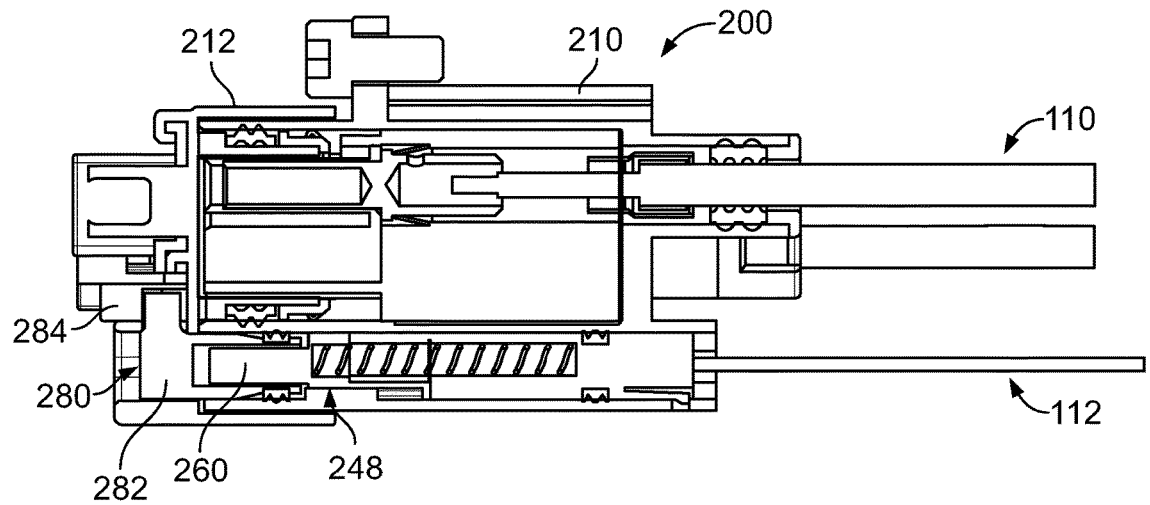
FIG. 20 is a cross-sectional view of the high voltage diagnostic connector shown in FIG. 5 in accordance with an exemplary embodiment.

FIG. 19 is a cross-sectional view of the high voltage diagnostic connector 200 showing the cover 212 coupled to the housing 210 with the cover actuator 280 in an un-actuated position. FIG. 20 is a cross-sectional view of the high voltage diagnostic connector 200 showing the cover 212 coupled to the housing 210 with the cover actuator 280 in an actuated position. The actuator button 282 is movable rearward from the actuated position to the un-actuated position. In the un-actuated position, the actuator button 282 is positioned to allow the HVIL switch 248 to be positioned in the un-actuated position. For example, the HVIL switch 248 is forward biased to—close the HVIL circuit 112 and activate the high voltage circuit 110. In the actuated position, the actuator button 282 is moved—forward to engage the HVIL switch 248. The actuator button 282 engages the HVIL switch actuator 260 and pushes the HVIL switch actuator 260 to the actuated position. In the actuated position, the HVIL shunt 254 is shunted between the HVIL contacts 250 to close the HVIL circuit 112 and activate the high voltage circuit 110. As such, with the cover 212 coupled to the housing 210 and the cover actuator 280 actuated, the high voltage circuit 110 may be operated normally. However, when the cover 212 is removed from the housing 210 (FIG. 18) the high voltage circuit 110 may be deactivated. Optionally, the cover actuator 280 may be un-actuated prior to removing the cover 212 from the housing 210. For example, the slider 284 may be moved to the actuated position to allow the actuator button 282 to release the HVIL switch 248 and open the HVIL circuit 112. With the HVIL circuit 112 open, the high voltage circuit 110 is deactivated and the vehicle may be safely serviced or stored on a dealer lot for extended periods of time with the high voltage battery isolated. The lockout device 202 could be placed on the connector to maintain this safe state.

Figure 21:
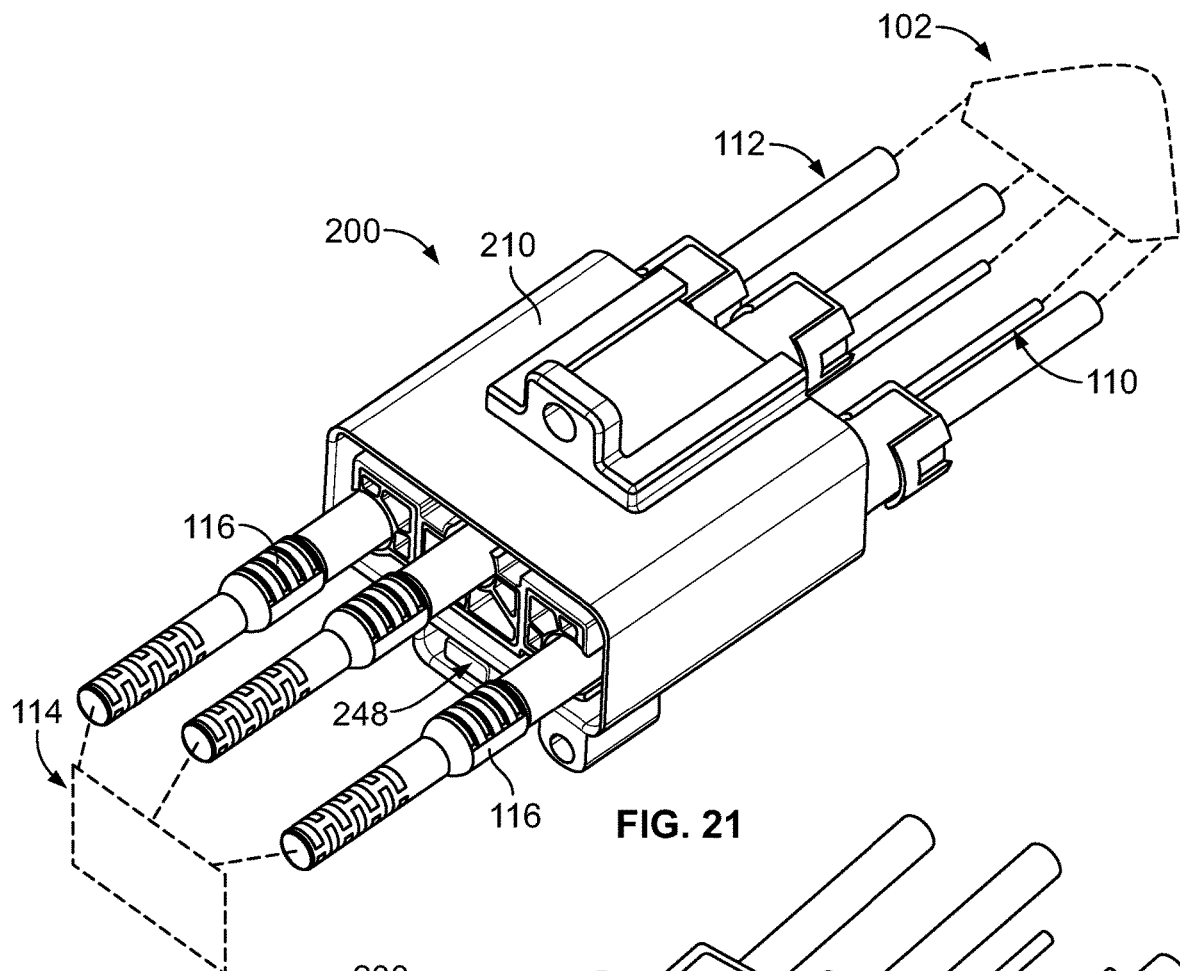
FIG. 21 illustrates the high voltage diagnostic connector shown in FIG. 5 with testing probes of a diagnostic testing device.

FIG. 21 illustrates the high voltage diagnostic connector 200 with the testing probes 116 of the diagnostic testing device 114 coupled to the terminals 230, 232, 234. In the illustrated embodiment, the HVIL switch 248 is depressed to close the HVIL circuit 112 and activate the high voltage circuit 110 for testing the battery system 102. For example, the voltage of the battery may be tested using the diagnostic testing device 114. After the HVIL switch 248 is released, the HVIL circuit 112 is opened to deactivate the high voltage circuit 110. With the HVIL circuit open, a technician can ensure the high voltage battery is isolated and high voltage is de-energized form the rest of the system and the vehicle is safe to service. The diagnostic connector also allows the technician to check if there are any shorts to ground before servicing the vehicle by checking the potential between the positive terminal 130, negative terminal 132 and ground terminal 134. Once all diagnostic functions are complete, the testing probes 116 may be uncoupled from the terminals 230, 232, 234. The cover 212 may then be recoupled to the housing 210 and secured thereto to provide a sealed and shielded high voltage diagnostic connector 200.

Figure 22:
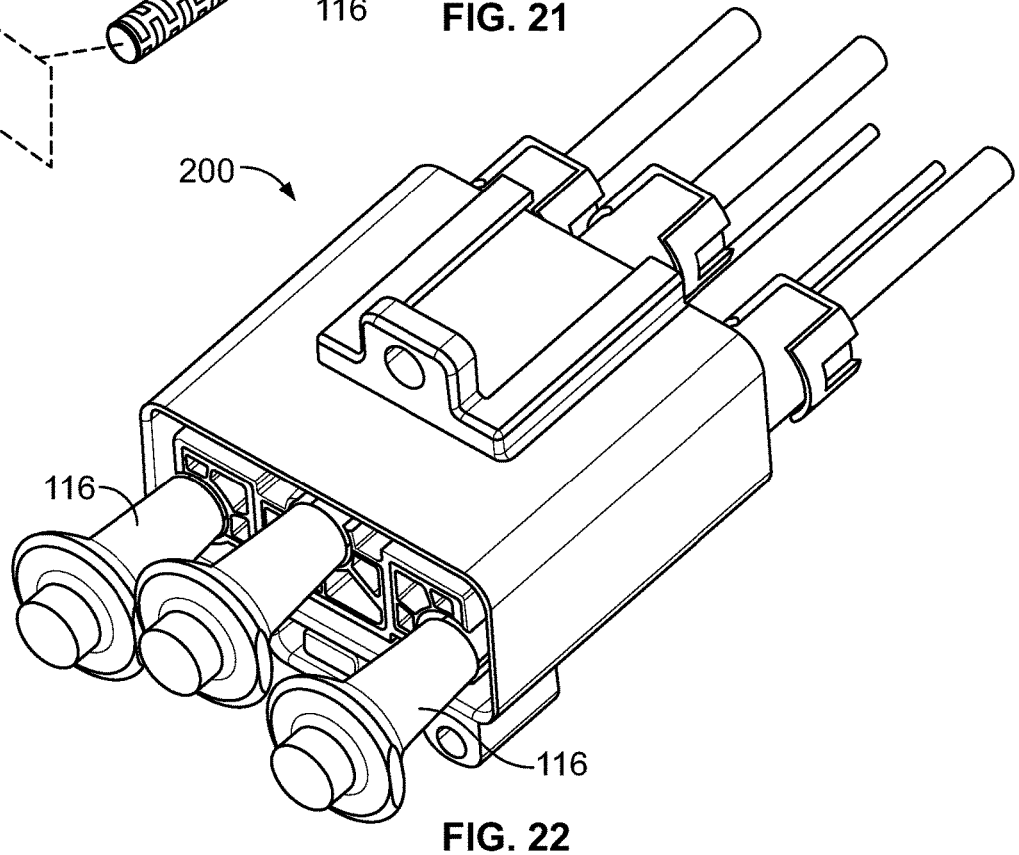
FIG. 22 illustrates the high voltage diagnostic connector shown in FIG. 5 with testing probes of a diagnostic testing device.

FIG. 22 illustrates the high voltage diagnostic connector 200 with lantern type of testing probes 116 coupled to the terminals 230, 232, 234 rather than the insulated wire probes shown in FIG. 21.

Figure 23:
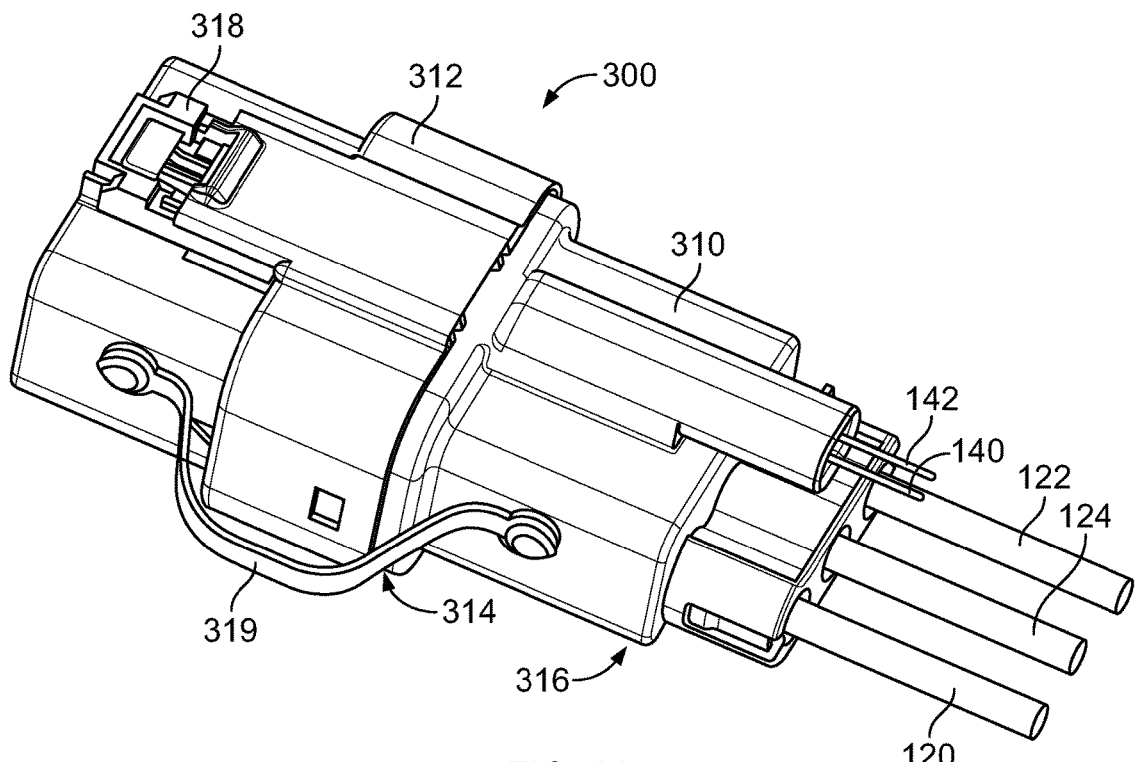
FIG. 23 is a top perspective view of the high voltage diagnostic connector shown in FIG. 1 in accordance with an exemplary embodiment.

FIG. 23 is a top perspective view of a high voltage diagnostic connector 300 in accordance with an exemplary embodiment. The high voltage diagnostic connector 300 is an exemplary implementation of the high voltage diagnostic connector 100 schematically illustrated in FIG. 1. The high voltage diagnostic connector 300 is usable within the battery system 102 (shown in FIG. 1). FIG. 23 illustrates the positive cable 120, the negative cable 122 and the ground cable 124 extending therefrom. FIG. 23 illustrates the first and second HVIL cables 140, 142 extending therefrom.

The high voltage diagnostic connector 300 includes a housing 310 and a cover 312 removably coupled to the housing 310. The housing 310 extends between a front 314 and a rear 316 and the cover 312 is coupled to the front 314. The cover 312 is removable from the housing 310 to access terminals of the high voltage diagnostic connector 300 for diagnostic testing of the high voltage circuit 110. In an exemplary embodiment, a latch 318 is used to secure the cover 312 to the housing 310. Other types of securing devices may be used to secure the cover 312 to the housing 310. In an exemplary embodiment, a tether 319 tethers the cover 312 to the housing 310 when the cover 312 is removed from the housing 310.

Figure 24:
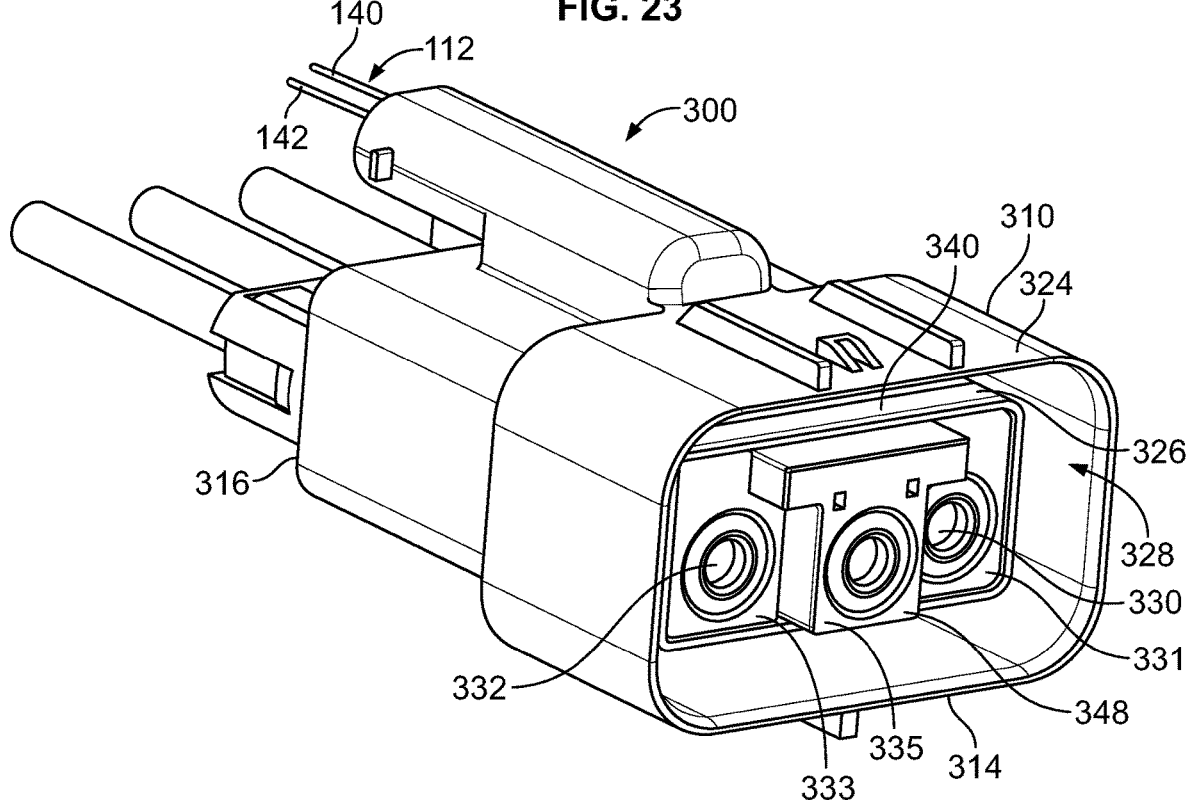
FIG. 24 is a front perspective view of a portion of the high voltage diagnostic connector shown in FIG. 23 in accordance with an exemplary embodiment.

FIG. 24 is a front perspective view of a portion of the high voltage diagnostic connector 300 in accordance with an exemplary embodiment. In an exemplary embodiment, the housing 310 includes an outer shell 324 and an inner housing 326 received in a cavity 328 of the outer shell 324. The inner housing 326 supports a positive terminal 330, a negative terminal 332 and a ground terminal 334. In an exemplary embodiment, the inner housing 326 holds terminal holders 331, 333, 335 holding the terminals 330, 332, 334, respectively. In other various embodiments, the inner housing 326 may directly hold the terminals 330, 332, 334 without the need for the separate terminal holders 331, 333, 335.

In an exemplary embodiment, the housing 310 includes a shield 340 providing electrical shielding for the terminals 330, 332, 334. The housing 310 may include a seal for sealing to the cover 312.

The high voltage diagnostic connector 300 includes an HVIL switch 348 used to open and close the HVIL circuit 112. The HVIL switch 348 is accessible at the front 314 and may be actuated between a primary position and a secondary position to close and open the HVIL circuit 112, respectively. In the illustrated embodiment, the terminal holder 335 forms part of the HVIL switch 348. For example, the terminal holder 335 may be movable relative to the housing 310 between the primary position and secondary position. Other terminal holders 331, 333 may form parts of the HVIL switch 348 in alternative embodiments.

Figure 25:
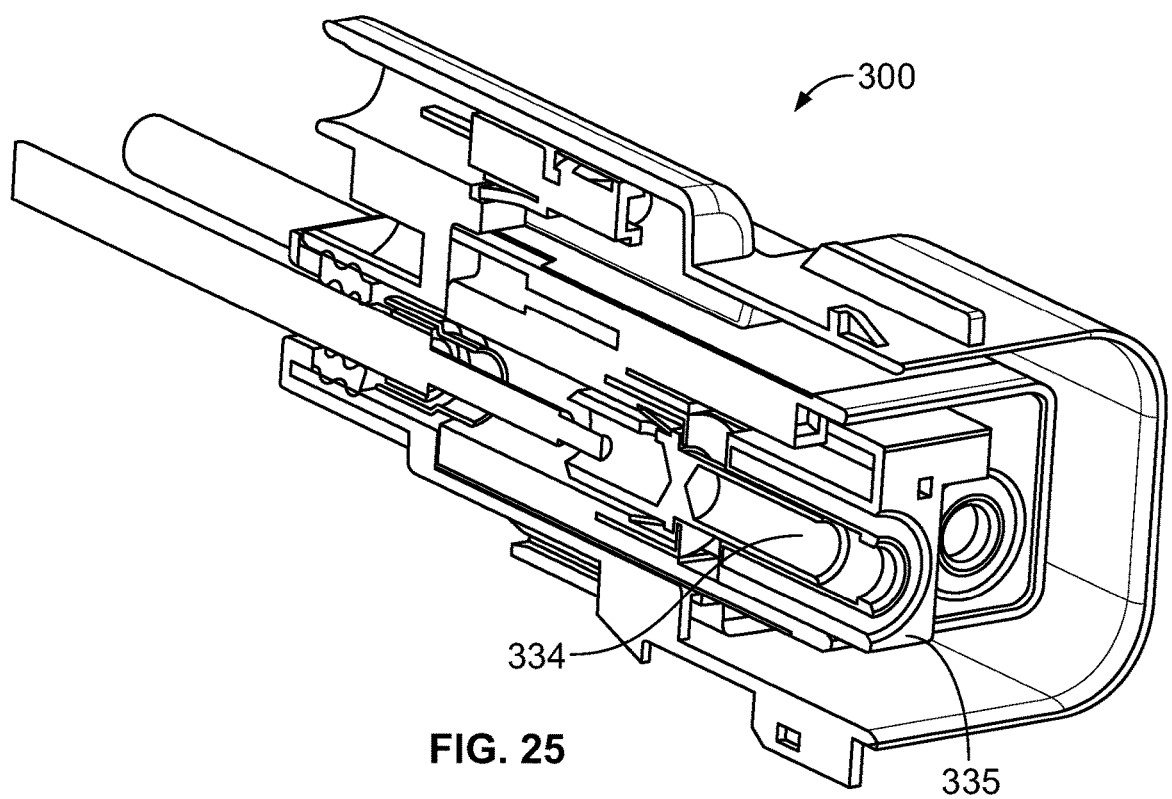
FIG. 25 is a partial sectional view of the high voltage diagnostic connector shown in FIG. 23 in accordance with an exemplary embodiment.

FIG. 25 is a partial sectional view of the high voltage diagnostic connector 300 in accordance with an exemplary embodiment. As shown in FIG. 25, the ground terminal 334 is held in the corresponding terminal holder 335. The terminal holder 335 is movable relative to the ground terminal 334. For example, the terminal holder 335 may slide along the ground terminal 334 between the primary position and the secondary position.

Figure 26:
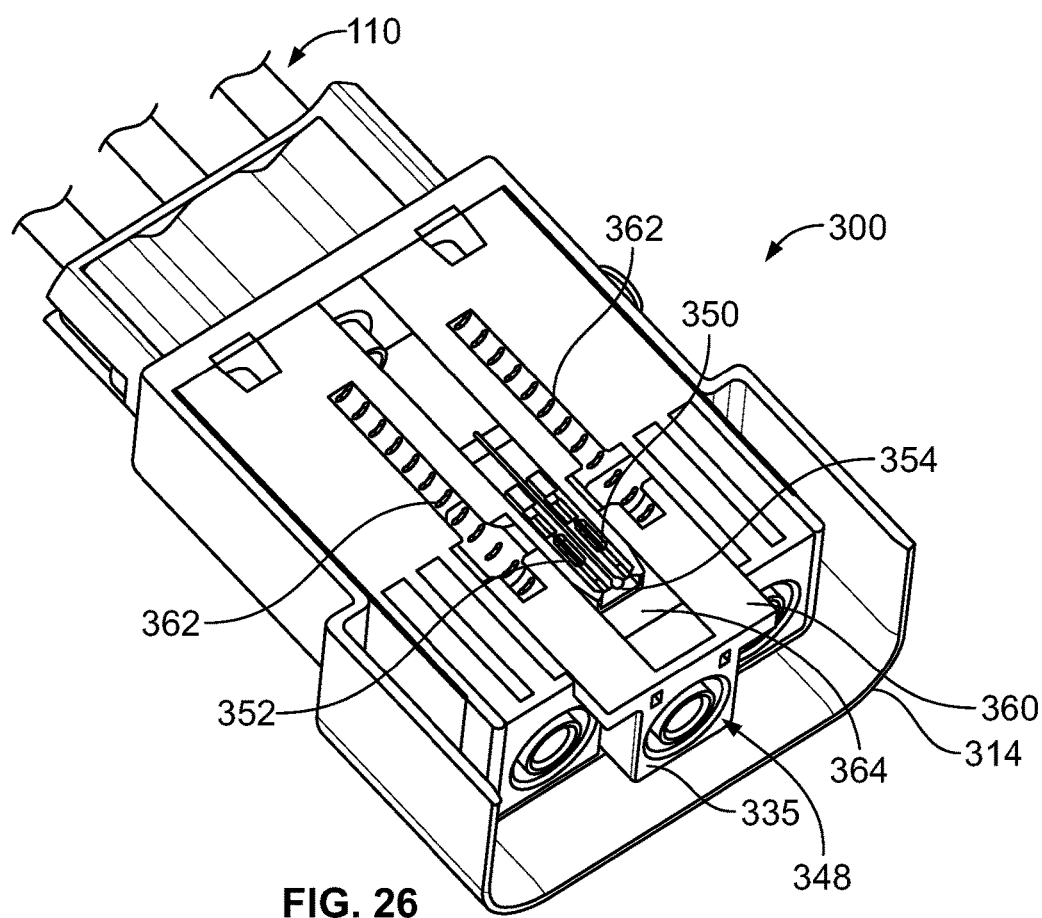
FIG. 26 is a partial sectional view of the high voltage diagnostic connector shown in FIG. 23 in accordance with an exemplary embodiment.

FIG. 26 is a partial sectional view of the high voltage diagnostic connector 300 in accordance with an exemplary embodiment. The HVIL switch 348 is used to open and close the HVIL circuit 112. In an exemplary embodiment, the HVIL switch 348 includes an HVIL shunt 354 is used to electrically connect HVIL contacts 350 to close the HVIL circuit 112 by a shunted connection. The HVIL switch 348 is used to operate the HVIL shunt 354 in an un-shunted position and a shunted position to open and close the HVIL circuit 112. The HVIL shunt 354 electrically connects the HVIL contacts 350 in the shunted position. The HVIL contacts 350 are electrically isolated when the HVIL shunt 354 is in the un-shunted position. Optionally, the HVIL shunt 354 may be moved, such as forward and rearward, with the terminal holder 335 when the HVIL switch 348 is operated. For example, in the illustrated embodiment, the HVIL shunt 354 is moved into contact with, and out of contact with, the HVIL contacts 350 as the HVIL shunt 354 is moved between the un-shunted position and the shunted position. In other various embodiments, the HVIL switch 348 may move one or both of the HVIL contacts 350 relative to each other and/or relative to the HVIL shunt 354 during operation to open and close the HVIL circuit 112.

In an exemplary embodiment, the HVIL switch 348 includes an HVIL switch actuator 360, a biasing member 362 operably coupled to the HVIL switch actuator 360, and a shunt actuator 364. In the illustrated embodiment, the HVIL switch actuator 360 is defined by the terminal holder 335. The terminal holder 335 is movable between the primary position and the secondary position by pressing the terminal holder 335 rearward. The terminal holder 335 may be pushed from the primary position to the secondary position by the cover or a component held by the cover in various embodiments. The terminal holder 335 may be manually actuated by the technician during the diagnostic testing process. For example, when the technician inserts a testing probe into the terminal holder 335, the terminal holder 335 may be pushed rearward by the testing probe to electrically connect the testing probe to the ground terminal 334. The biasing member 362 forces the HVIL switch actuator 360 forward to the primary position. For example, when the terminal holder 335 is released, the terminal holder 335 may return to the primary position.

In the illustrated embodiment, the shunt actuator 364 is defined by the terminal holder 335. For example, the terminal holder 335 includes a ramp surface along the top of the pocket that receives the HVIL shunt 354. As the terminal holder 335 moves rearward, the ramp surface engages the HVIL shunt 354 and drives the HVIL shunt 354 upward into contact with the HVIL contacts 350. Other types of shunt actuators may be used in alternative embodiments. The shunt actuator 364 is movable with the HVIL switch actuator 360 as both the shunt actuator 364 and the HVIL switch actuator 360 are defined by the terminal holder 335 in the illustrated embodiment. The HVIL switch actuator 360 is accessible at the front 314 and configured to be actuated from the primary position to the secondary position to activate the HVIL shunt 354. The shunt actuator 364 moves the HVIL shunt 354 to the shunted position. The HVIL circuit 112 is closed in the shunted position, thus activating the high voltage circuit 110. It may be desirable for the technician to activate the high voltage circuit 110 during the diagnostic testing process, such as when the diagnostic testing device 114 is coupled to the high voltage diagnostic connector 300. Other types of actuators may be used in alternative embodiments having other types of movement other than linear forward and rearward movement.

Figure 27:
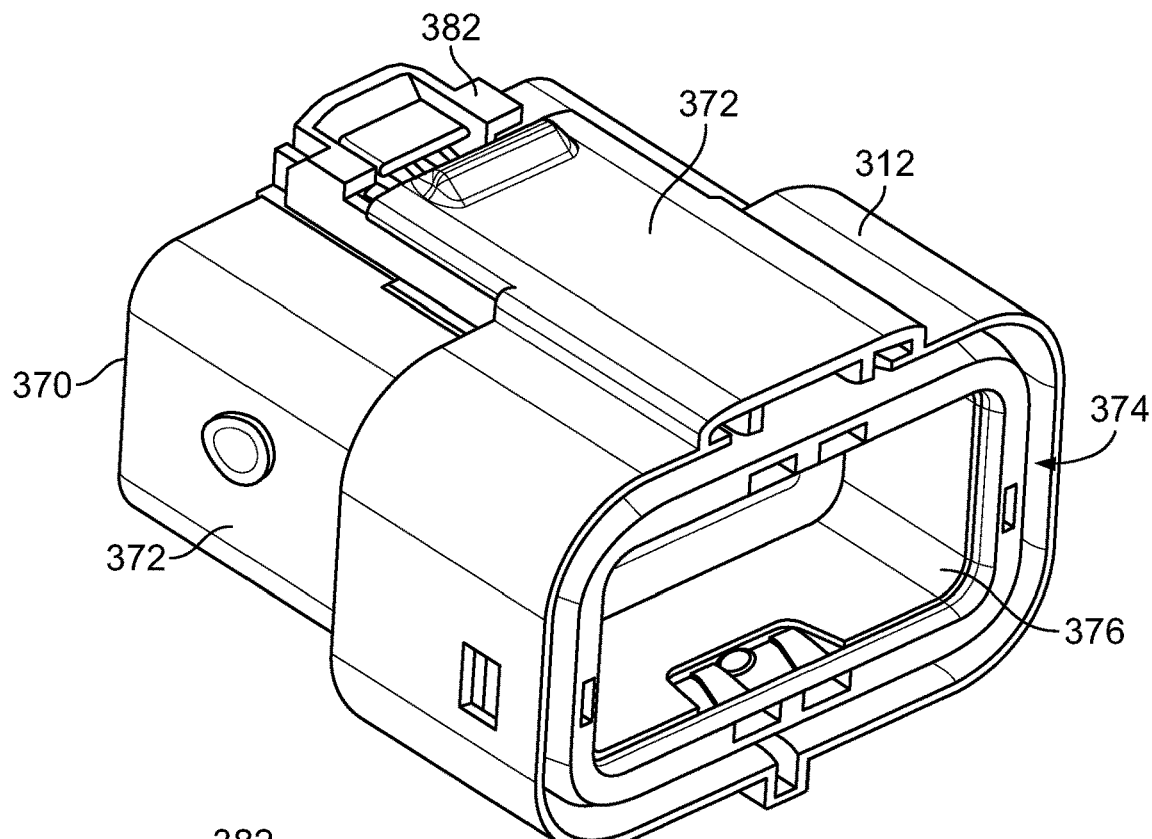
FIG. 27 is a rear perspective view of a cover of the high voltage diagnostic connector shown in FIG. 23 in accordance with an exemplary embodiment.
Figure 28:
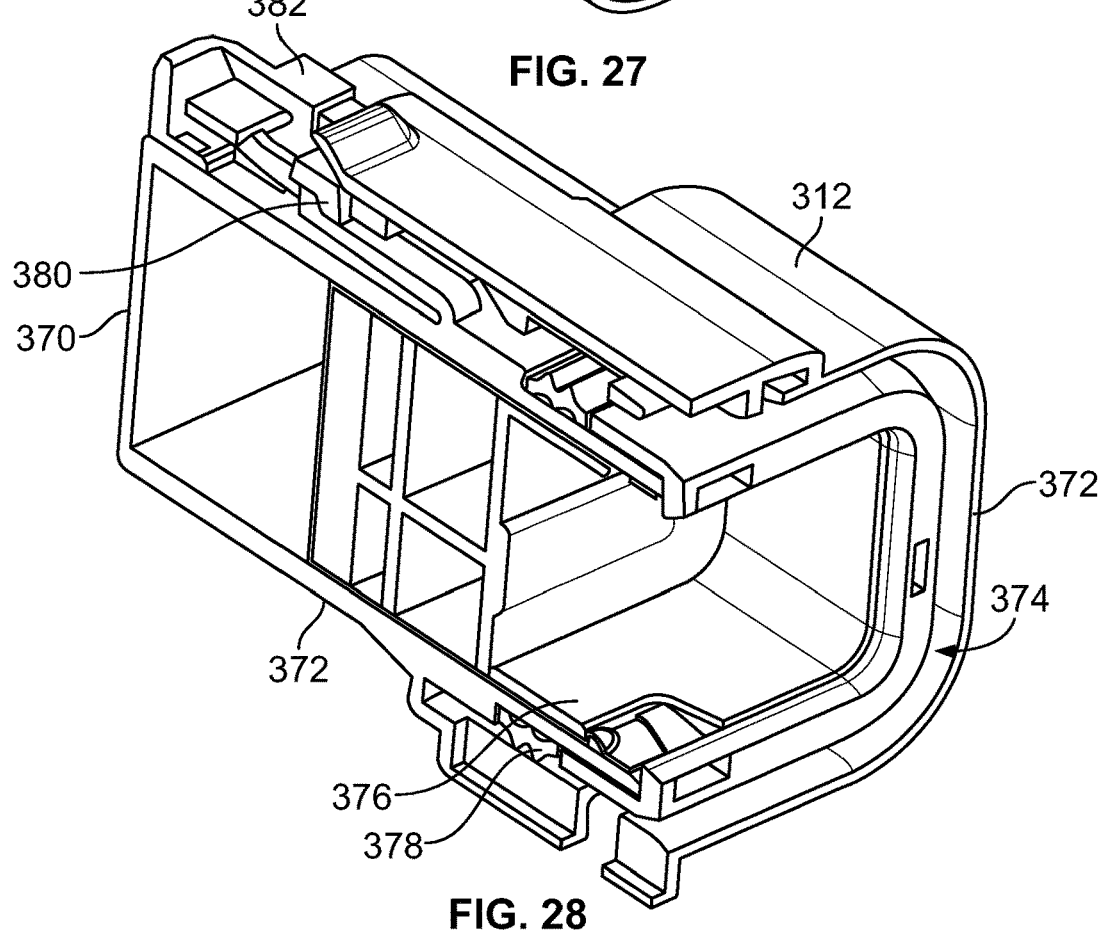
FIG. 28 is a cross-sectional view of the cover shown in FIG. 27 in accordance with an exemplary embodiment.

FIG. 27 is a rear perspective view of the cover 312 in accordance with an exemplary embodiment. FIG. 28 is a cross-sectional view of the cover 312 in accordance with an exemplary embodiment. The cover 312 includes a front wall 370 and sidewalls 372 defining a cavity 374. In an exemplary embodiment, the cavity 374 has a shield 376 for providing electrical shielding within the cover 312, such as for shielding the terminals 330, 332, 334 (shown in FIG. 24). In an exemplary embodiment, the cover 312 includes a seal 378 configured to be sealed to the housing 310 when coupled thereto.

The cover 312 includes a cover actuator 380 configured to be operably coupled to the housing 310 to move the cover 312 from an intermediate or staged position to a closed position. The cover actuator 380 allows actuation of the HVIL switch 348 from the exterior of the cover 312 by moving the cover 312 from the staged position to the closed position. In an exemplary embodiment, the cover actuator 380 includes a latch 382 configured to engage the corresponding latch on the housing 310.

Figure 29:
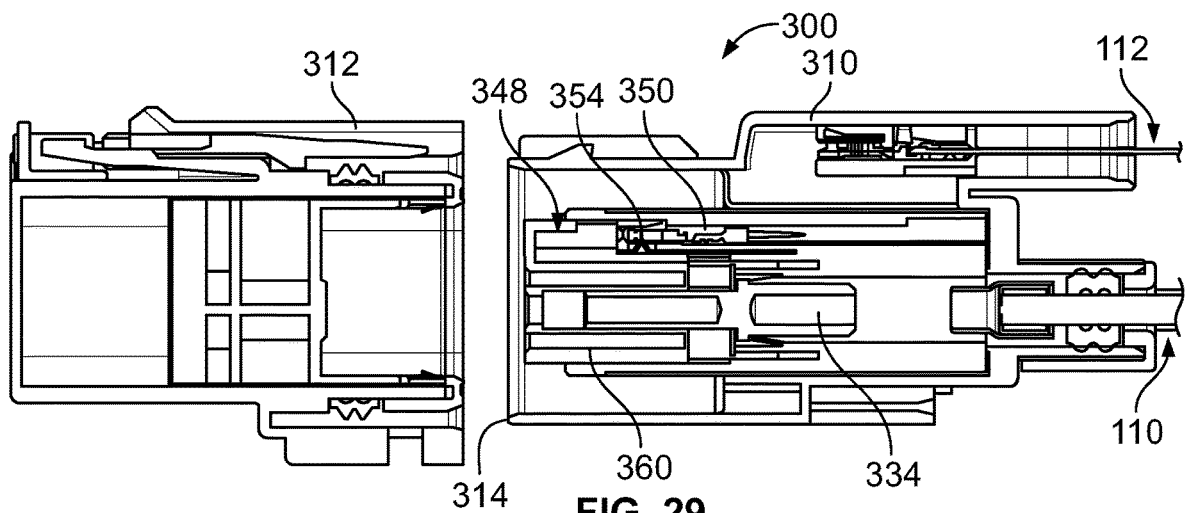
FIG. 29 is a cross-sectional view of the high voltage diagnostic connector shown in FIG. 23 in accordance with an exemplary embodiment.

FIG. 29 is a cross-sectional view of the high voltage diagnostic connector 300 showing the cover 312 uncoupled from the housing 310. When the cover 312 is removed from the housing 310, the HVIL switch 348 is extended or un-actuated. For example, the biasing member 362 forces the HVIL switch actuator 360 forward to the primary position. In the primary position, the HVIL shunt 354 is in the un-shunted position, and thus the HVIL circuit 112 is open and the high voltage circuit 110 is inactive. As such, the terminals 330, 332, 334 are dead and there is no risk of electrical shock to the technician.

When the cover 312 is removed, the terminals 330, 332, 334 are exposed at the front 314 for diagnostic testing. The technician may connect the diagnostic testing device 114 to the terminals 330, 332, 334. When the cover 312 is uncoupled, the HVIL switch actuator 360 is exposed at the front 314 for manual activation by the technician. Once the diagnostic testing device 114 (FIG. 1) is coupled to the terminals 330, 332, 334, the technician may actuate the HVIL switch 348 by pressing inward on the HVIL switch actuator 360 to electrically connect the HVIL shunt 354 to the HVIL contacts 350 to close the HVIL circuit 112 and activate the high voltage circuit 110 for testing of the high voltage circuit 110. The technician may then release the HVIL switch 348 to again open the HVIL circuit 112 and deactivate the high voltage circuit 110. Once testing is complete, the cover 312 may be re-coupled to the housing 310.

Figure 30:
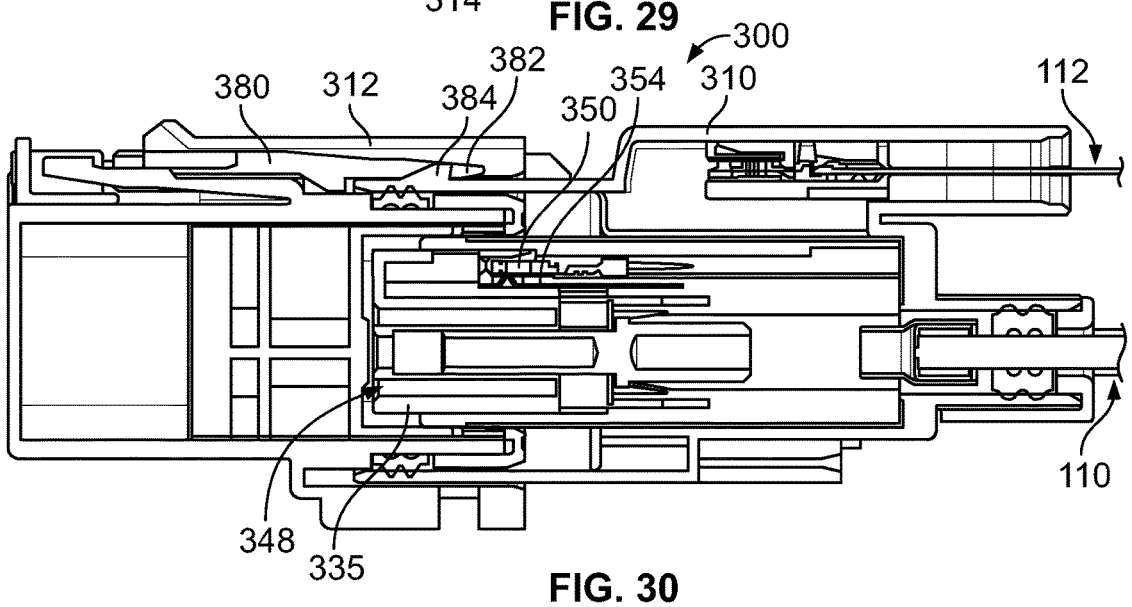
FIG. 30 is a cross-sectional view of the high voltage diagnostic connector shown in FIG. 23 in accordance with an exemplary embodiment.
Figure 31:
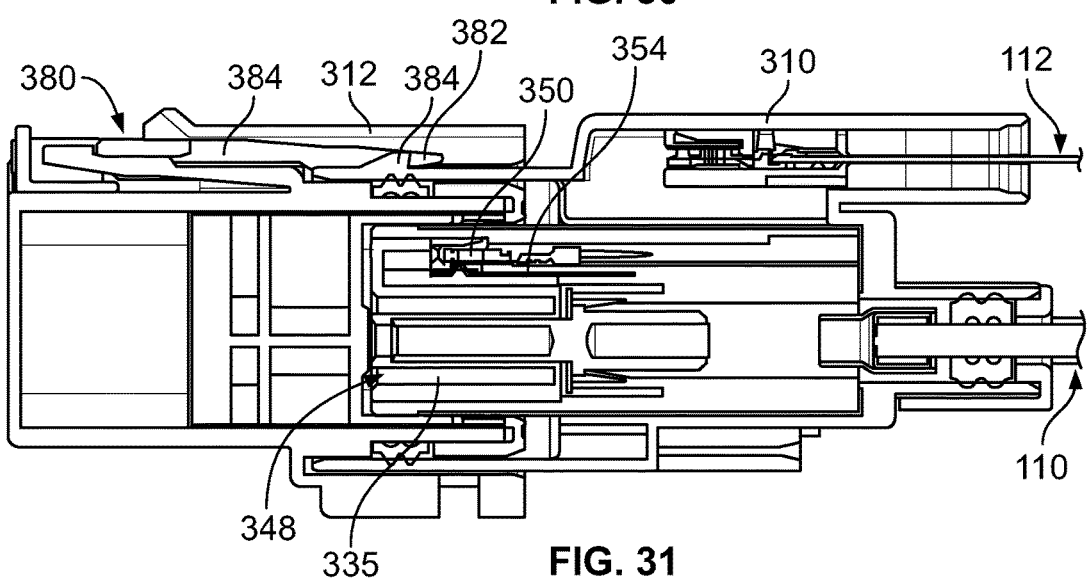
FIG. 31 is a cross-sectional view of the high voltage diagnostic connector shown in FIG. 23 in accordance with an exemplary embodiment.

FIG. 30 is a cross-sectional view of the high voltage diagnostic connector 300 showing the cover 312 coupled to the housing 310 with the cover 312 in a staged position. FIG. 31 is a cross-sectional view of the high voltage diagnostic connector 300 showing the cover 312 coupled to the housing 310 in a closed position. The cover actuator 380 may be used to hold the cover 312 in the staged position and/or in the closed position. For example, the latch 382 of the cover 312 engages a corresponding latch 384 of the housing 310. The latch 382 may be used to hold the cover 312 in the staged position. The latch 382 may be actuated to close the cover 312 to the closed position. In other various embodiments, the latch 382 may engage a second latch on the housing 310 in the closed position.

As the cover 312 is moved from the staged position to the closed position, the cover 312 engages the HVIL switch 348 to actuate the HVIL switch 348. For example, the cover 312 engages the front surface of the terminal holder 335 and pushes the terminal holder 335 as the cover 312 is moved from the staged position to the closed position. In the staged position, the HVIL shunt 354 is in the un-shunted position. In the closed position, the HVIL shunt 354 is in the shunted position. As such, when the cover 312 is moved to the closed position, the HVIL circuit 112 is closed to activate the high voltage circuit 110.

Figure 32:
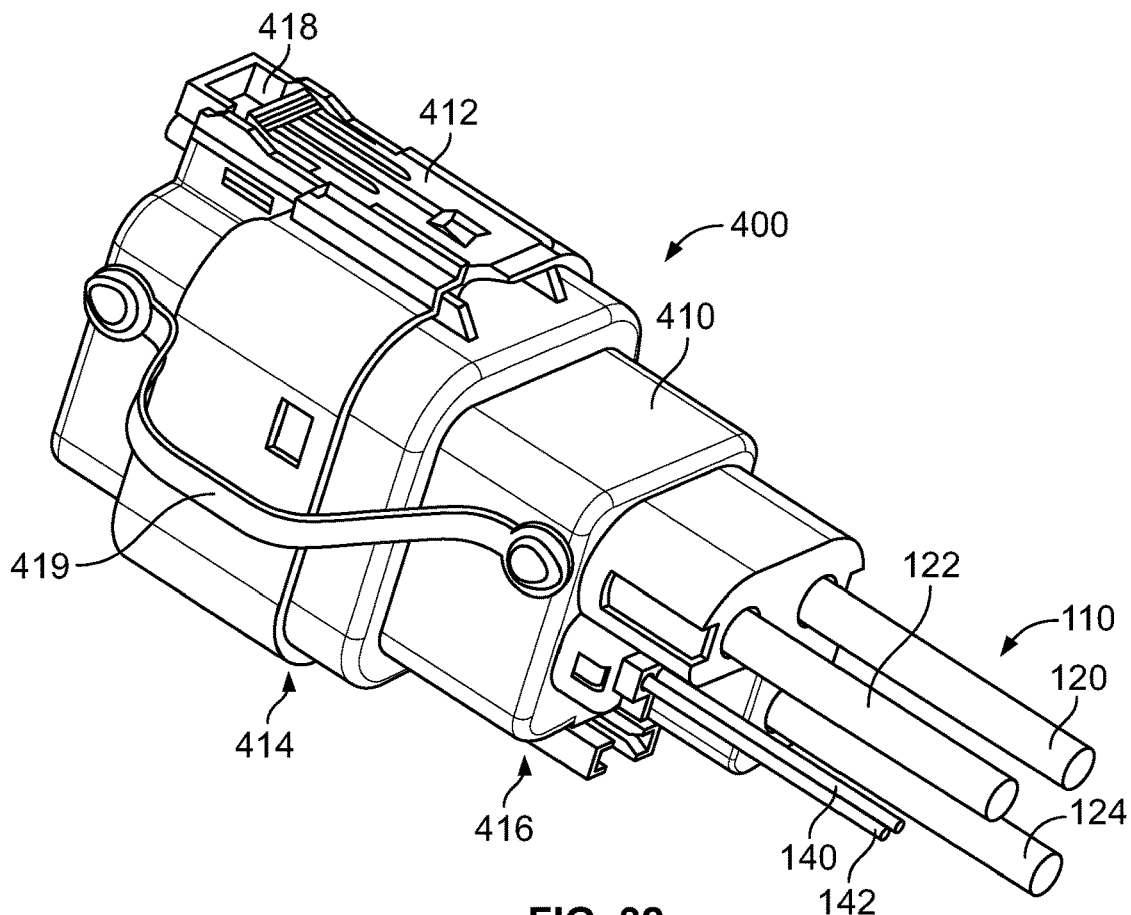
FIG. 32 is a top perspective view of the high voltage diagnostic connector shown in FIG. 1 in accordance with an exemplary embodiment.

FIG. 32 is a top perspective view of a high voltage diagnostic connector 400 in accordance with an exemplary embodiment. The high voltage diagnostic connector 400 is an exemplary implementation of the high voltage diagnostic connector 100 schematically illustrated in FIG. 1. The high voltage diagnostic connector 400 is usable within the battery system 102 (shown in FIG. 1). FIG. 32 illustrates the positive cable 120, the negative cable 122 and the ground cable 124 extending therefrom. FIG. 32 illustrates the first and second HVIL cables 140, 142 extending therefrom.

The high voltage diagnostic connector 400 includes a housing 410 and a cover 412 removably coupled to the housing 410. The housing 410 extends between a front 414 and a rear 416 and the cover 412 is coupled to the front 414. The cover 412 is removable from the housing 410 to access terminals of the high voltage diagnostic connector 400 for diagnostic testing of the high voltage circuit 110. In an exemplary embodiment, a latch 418 is used to secure the cover 412 to the housing 410. Other types of securing devices may be used to secure the cover 412 to the housing 410. In an exemplary embodiment, a tether 419 tethers the cover 412 to the housing 410 when the cover 412 is removed from the housing 410.

Figure 33:
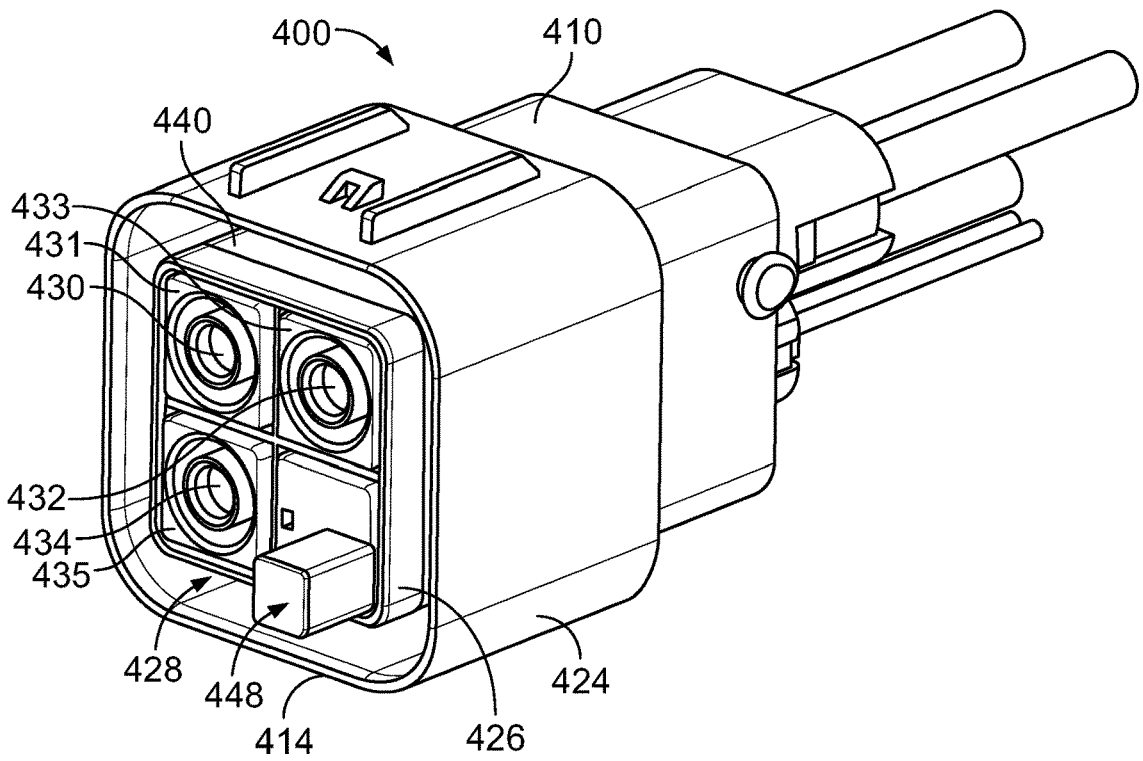
FIG. 33 is a front perspective view of a portion of the high voltage diagnostic connector shown in FIG. 32 in accordance with an exemplary embodiment.

FIG. 33 is a front perspective view of a portion of the high voltage diagnostic connector 400 in accordance with an exemplary embodiment. In an exemplary embodiment, the housing 410 includes an outer shell 424 and an inner housing 426 received in a cavity 428 of the outer shell 424. The inner housing 426 supports a positive terminal 430, a negative terminal 432 and a ground terminal 434. In an exemplary embodiment, the inner housing 426 holds terminal holders 431, 433, 435 holding the terminals 430, 432, 434, respectively. In other various embodiments, the inner housing 426 may directly hold the terminals 430, 432, 434 without the need for the separate terminal holders 431, 433, 435.

In an exemplary embodiment, the housing 410 includes a shield 440 providing electrical shielding for the terminals 430, 432, 434. The housing 410 may include a seal for sealing to the cover 412.

The high voltage diagnostic connector 400 includes an HVIL switch 448 used to open and close the HVIL circuit 112. The HVIL switch 448 is accessible at the front 414 and may be actuated between a primary position and a secondary position to close and open the HVIL circuit 112, respectively.

Figure 34:
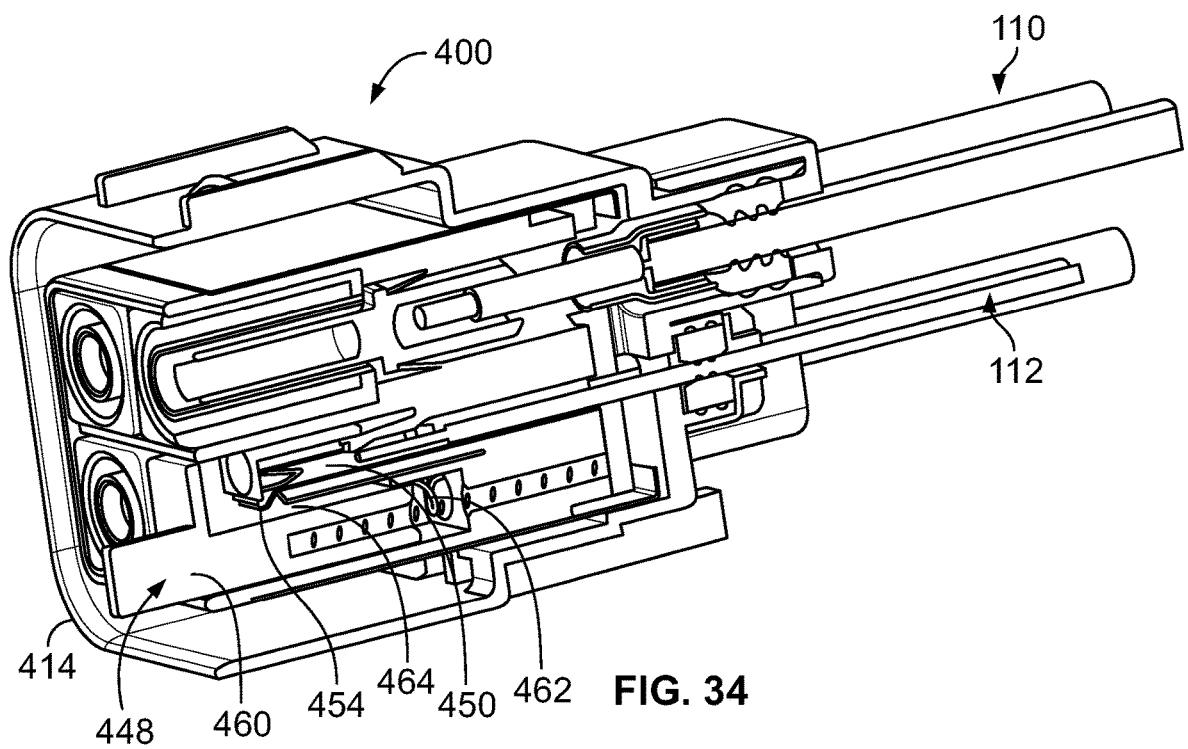
FIG. 34 is a partial sectional view of the high voltage diagnostic connector shown in FIG. 32 in accordance with an exemplary embodiment.

FIG. 34 is a partial sectional view of the high voltage diagnostic connector 400 in accordance with an exemplary embodiment. The HVIL switch 448 is used to open and close the HVIL circuit 112. In an exemplary embodiment, the HVIL switch 448 includes an HVIL shunt 454 is used to electrically connect HVIL contacts 450 to close the HVIL circuit 112 by a shunted connection. The HVIL switch 448 is used to operate the HVIL shunt 454 in an un-shunted position and a shunted position to open and close the HVIL circuit 112. The HVIL shunt 454 electrically connects the HVIL contacts 450 in the shunted position. The HVIL contacts 450 are electrically isolated when the HVIL shunt 454 is in the un-shunted position. Optionally, the HVIL shunt 454 may be moved, such as forward and rearward, with the HVIL switch 448 when the HVIL switch 448 is operated. For example, in the illustrated embodiment, the HVIL shunt 454 is moved into contact with, and out of contact with, the HVIL contacts 450 as the HVIL shunt 454 is moved between the un-shunted position and the shunted position. In other various embodiments, the HVIL switch 448 may move one or both of the HVIL contacts 450 relative to each other and/or relative to the HVIL shunt 454 during operation to open and close the HVIL circuit 112.

In an exemplary embodiment, the HVIL switch 448 includes an HVIL switch actuator 460, a biasing member 462 operably coupled to the HVIL switch actuator 460, and a shunt actuator 464. In the illustrated embodiment, the HVIL switch actuator 460 is defined by a push button. The HVIL switch actuator 460 is movable between the primary position and the secondary position by pressing the HVIL switch actuator 460 rearward. The HVIL switch actuator 460 may be pushed from the primary position to the secondary position by the cover or a component held by the cover in various embodiments. The HVIL switch actuator 460 may be manually actuated by the technician during the diagnostic testing process. The biasing member 462 forces the HVIL switch actuator 460 forward to the primary position. For example, when the HVIL switch actuator 460 is released, the HVIL switch 448 may return to the primary position.

In the illustrated embodiment, the shunt actuator 464 is defined by a ramp surface along the top of the push button that holds the HVIL shunt 454. As the HVIL switch 448 moves rearward, the ramp surface engages the HVIL shunt 454 and drives the HVIL shunt 454 upward into contact with the HVIL contacts 450. Other types of shunt actuators may be used in alternative embodiments. The shunt actuator 464 is movable with the HVIL switch actuator 460 as both the shunt actuator 464 and the HVIL switch actuator 460 are defined by the push button in the illustrated embodiment. The HVIL switch actuator 460 is accessible at the front 414 and configured to be actuated from the primary position to the secondary position to activate the HVIL shunt 454. The shunt actuator 464 moves the HVIL shunt 454 to the shunted position. The HVIL circuit 112 is closed in the shunted position, thus activating the high voltage circuit 110. It may be desirable for the technician to activate the high voltage circuit 110 during the diagnostic testing process, such as when the diagnostic testing device 114 is coupled to the high voltage diagnostic connector 400. Other types of actuators may be used in alternative embodiments having other types of movement other than linear forward and rearward movement.

Figure 35:
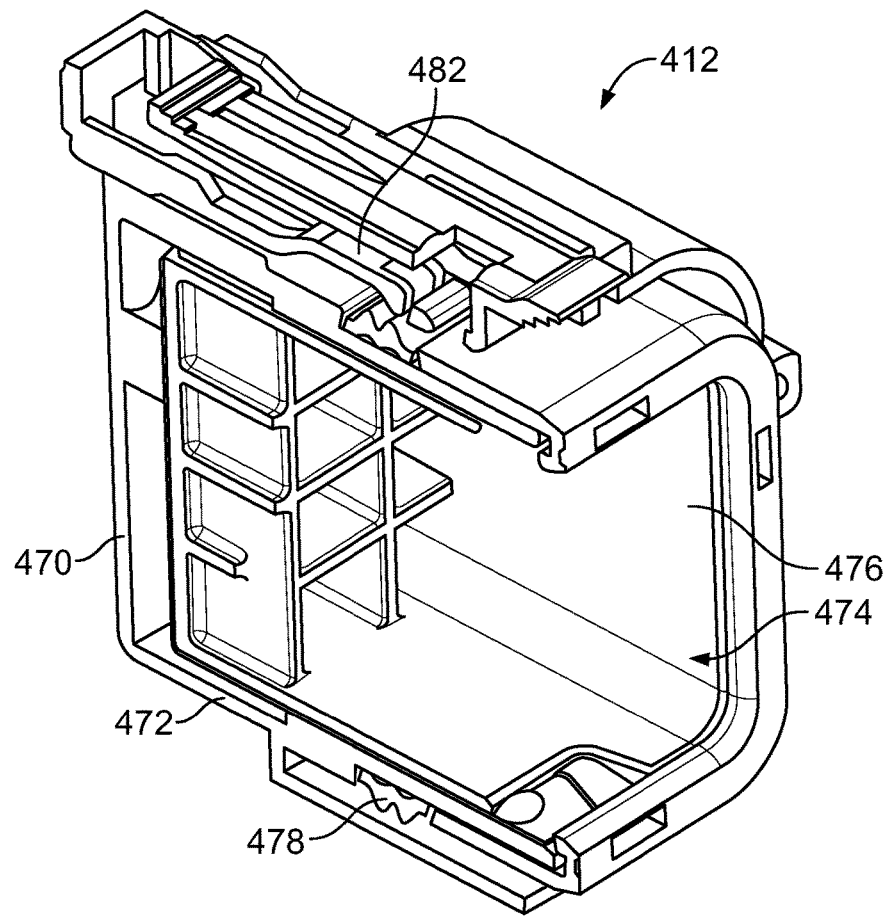
FIG. 35 is a cross-sectional view of a cover of the high voltage diagnostic connector shown in FIG. 32 in accordance with an exemplary embodiment.

FIG. 35 is a cross-sectional view of the cover 412 in accordance with an exemplary embodiment. The cover 412 includes a front wall 470 and sidewalls 472 defining a cavity 474. In an exemplary embodiment, the cavity 474 has a shield 476 for providing electrical shielding within the cover 412, such as for shielding the terminals 430, 432, 434 (shown in FIG. 24). In an exemplary embodiment, the cover 412 includes a seal 478 configured to be sealed to the housing 410 when coupled thereto. The cover 412 includes a latch 482 configured to engage the corresponding latch on the housing 410.

Figure 36:
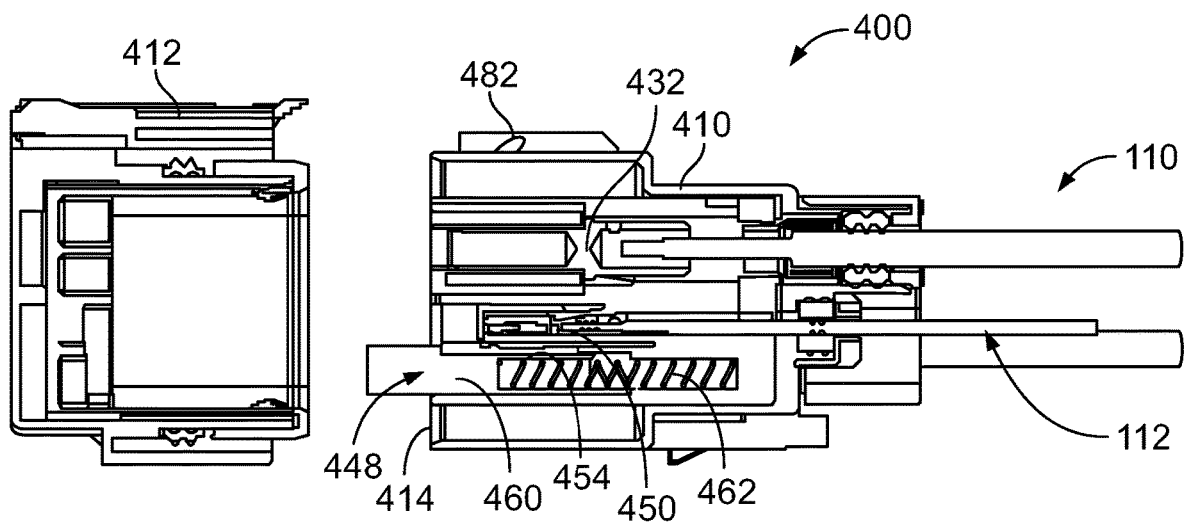
FIG. 36 is a cross-sectional view of the high voltage diagnostic connector shown in FIG. 32 in accordance with an exemplary embodiment.

FIG. 36 is a cross-sectional view of the high voltage diagnostic connector 400 showing the cover 412 uncoupled from the housing 410. When the cover 412 is removed from the housing 410, the HVIL switch 448 is extended or un-actuated. For example, the biasing member 462 forces the HVIL switch actuator 460 forward to the primary position. In the primary position, the HVIL shunt 454 is in the un-shunted position, and thus the HVIL circuit 112 is open and the high voltage circuit 110 is inactive. As such, the terminals 430, 432, 434 are dead and there is no risk of electrical shock to the technician.

When the cover 412 is removed, the terminals 430, 432, 434 are exposed at the front 414 for diagnostic testing. The technician may connect the diagnostic testing device 114 to the terminals 430, 432, 434. When the cover 412 is uncoupled, the HVIL switch actuator 460 is exposed at the front 414 for manual activation by the technician. Once the diagnostic testing device 114 (FIG. 1) is coupled to the terminals 430, 432, 434, the technician may actuate the HVIL switch 448 by pressing inward on the HVIL switch actuator 460 to electrically connect the HVIL shunt 454 to the HVIL contacts 450 to close the HVIL circuit 112 and activate the high voltage circuit 110 for testing of the high voltage circuit 110. The technician may then release the HVIL switch 448 to again open the HVIL circuit 112 and deactivate the high voltage circuit 110. Once testing is complete, the cover 412 may be re-coupled to the housing 410.

Figure 37:
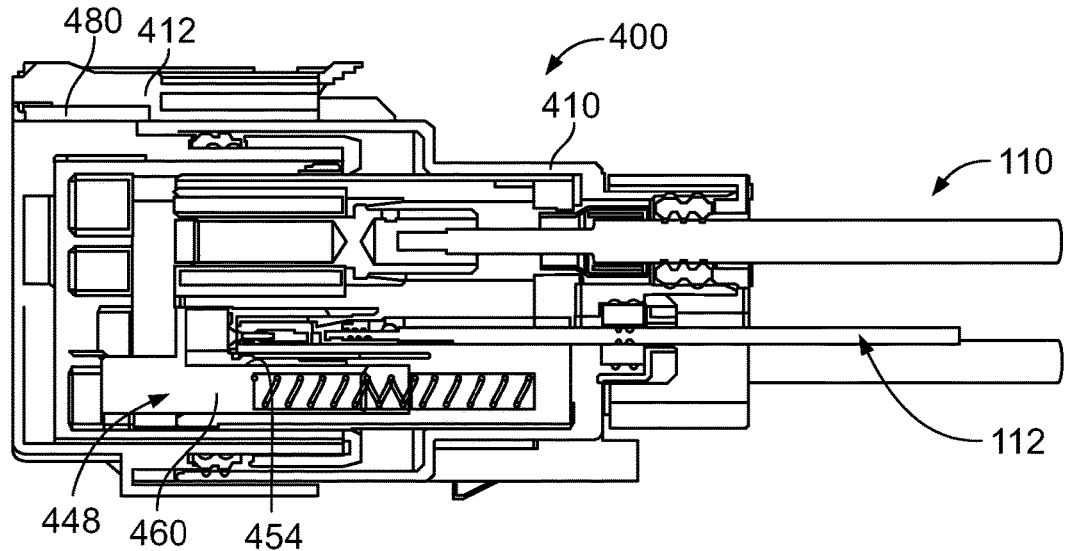
FIG. 37 is a cross-sectional view of the high voltage diagnostic connector shown in FIG. 32 in accordance with an exemplary embodiment.
Figure 38:
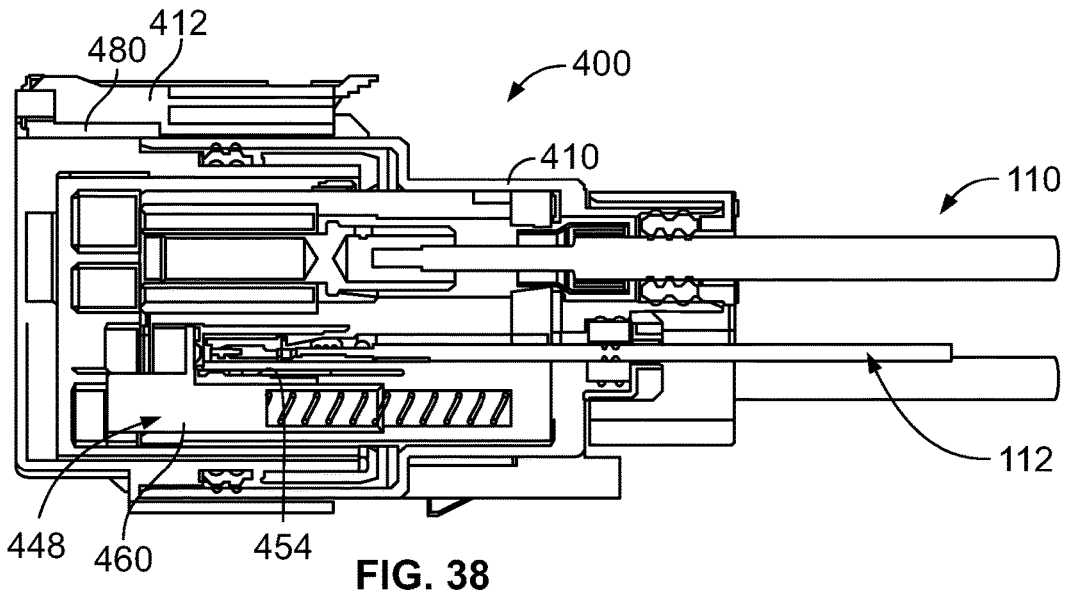
FIG. 38 is a cross-sectional view of the high voltage diagnostic connector shown in FIG. 32 in accordance with an exemplary embodiment.

FIG. 37 is a cross-sectional view of the high voltage diagnostic connector 400 showing the cover 412 coupled to the housing 410 with the cover 412 in an intermediate or staged position. FIG. 38 is a cross-sectional view of the high voltage diagnostic connector 400 showing the cover 412 coupled to the housing 410 in a closed position. The cover 412 is moved rearward from the staged position to the closed position. A latch 480 may be used to hold the cover 412 in the staged position and/or in the closed position. For example, the latch 480 of the cover 412 engages a corresponding latch 482 (FIG. 36) of the housing 410.

As the cover 412 is moved from the staged position to the closed position, the cover 412 engages the HVIL switch 448 to actuate the HVIL switch 448. For example, the cover 412 engages the front surface of the HVIL switch actuator 460 and pushes the HVIL switch actuator 460 rearward as the cover 412 is moved from the staged position to the closed position. As such, the cover 412 is used to move the HVIL switch 448. In the staged position, the HVIL shunt 454 is in the un-shunted position, and thus the HVIL circuit 112 is open and the high voltage circuit 110 is deactivated. In the closed position, the HVIL shunt 454 is in the shunted position, and thus the HVIL circuit 112 is closed and the high voltage circuit 110 is activated. The cover 412 is used to move the HVIL switch actuator 460. As such, when the cover 412 is moved to the closed position, the HVIL circuit 112 is closed to activate the high voltage circuit 110. The operator does not have to separately actuate the HVIL switch actuator 460, but rather the HVIL circuit 112 is closed and opened by coupling and uncoupling the cover 412 to and from the housing 410.

Figure 39:
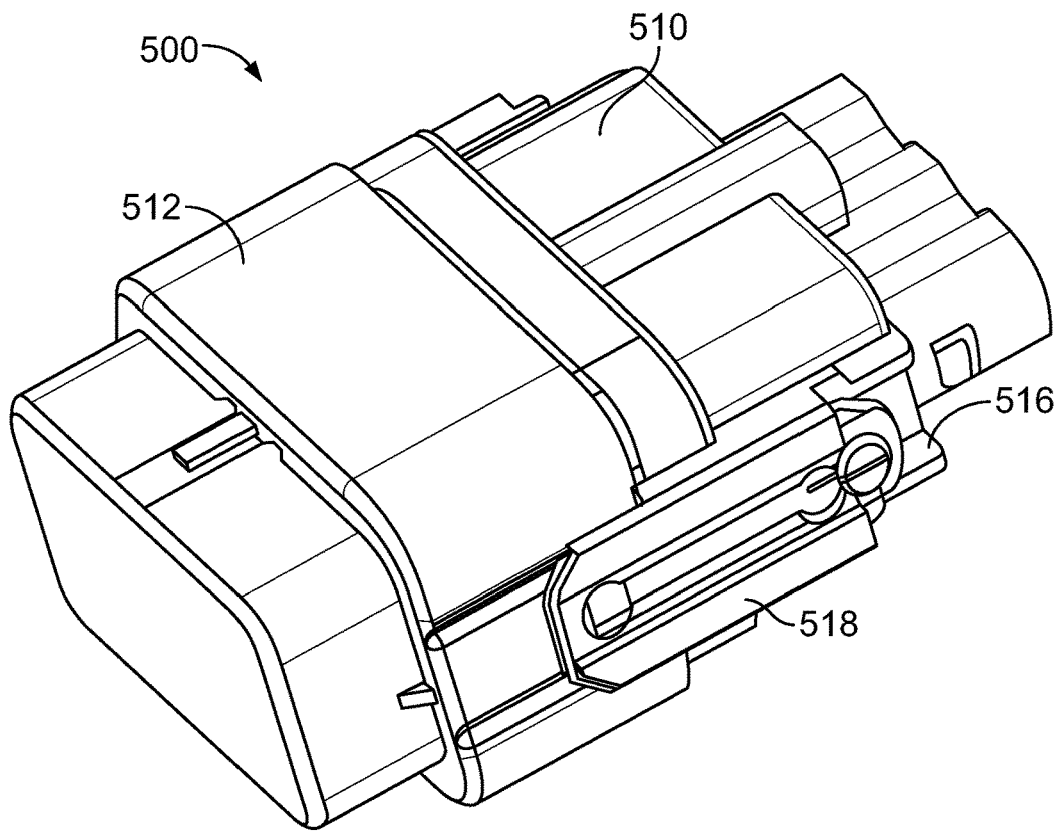
FIG. 39 is a top perspective view of the high voltage diagnostic connector shown in FIG. 1 in accordance with an exemplary embodiment.
Figure 40:
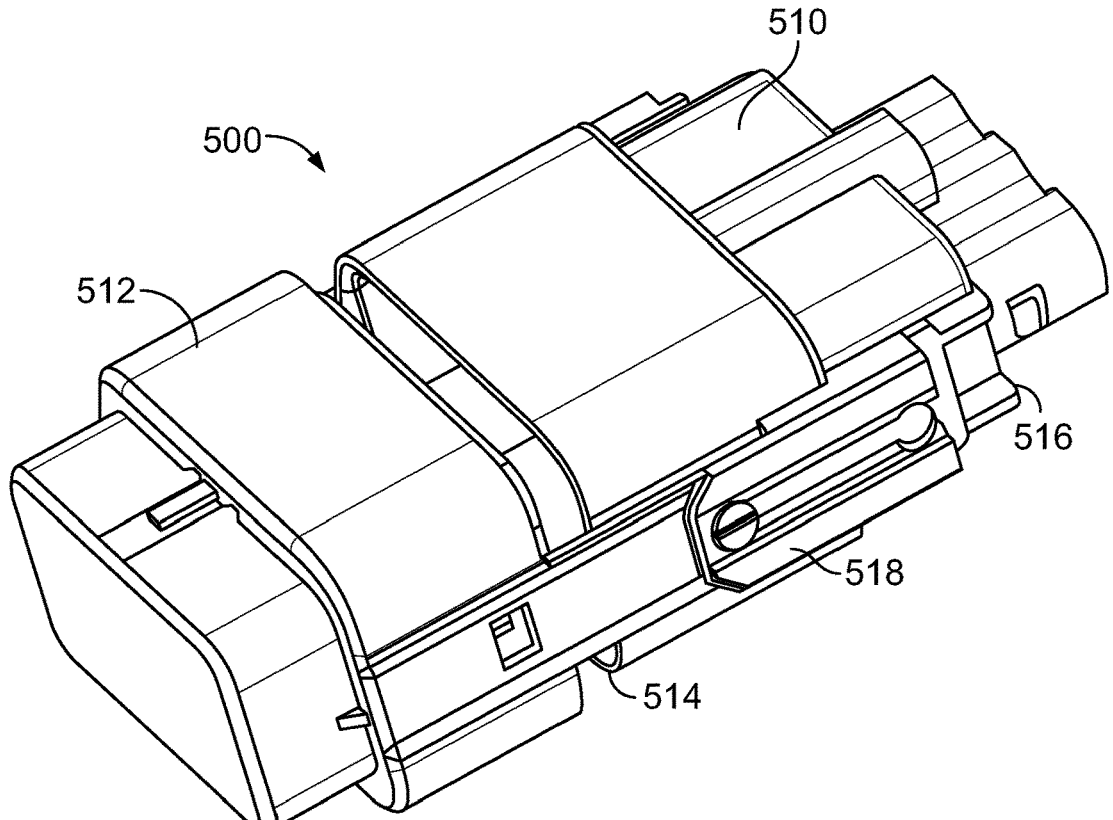
FIG. 40 is a top perspective view of the high voltage diagnostic connector shown in FIG. 39 in accordance with an exemplary embodiment.

FIG. 39 is a top perspective view of a high voltage diagnostic connector 500 in accordance with an exemplary embodiment. FIG. 40 is a top perspective view of the high voltage diagnostic connector 500 in accordance with an exemplary embodiment. FIG. 39 shows the high voltage diagnostic connector 500 in a closed position. FIG. 40 shows the high voltage diagnostic connector 500 in an open position. The high voltage diagnostic connector 500 is an exemplary implementation of the high voltage diagnostic connector 100 schematically illustrated in FIG. 1. The high voltage diagnostic connector 500 is usable within the battery system 102 (shown in FIG. 1).

The high voltage diagnostic connector 500 includes a housing 510 and a cover 512 removably coupled to the housing 510. The housing 510 extends between a front 514 and a rear 516 and the cover 512 is coupled to the front 514. The cover 512 is removable from the housing 510 to access terminals of the high voltage diagnostic connector 500 for diagnostic testing of the high voltage circuit 110. In an exemplary embodiment, latches 518 are used to secure the cover 512 to the housing 510. Optionally, the latches 518 may provide staged mating of the cover 512 to the housing 510. In the illustrated embodiment, the latches 518 are pivotably coupled to the housing 510 to allow the cover 512 to rotate upward or downward to provide access to the front 514 of the housing 510 and the terminals for diagnostic testing. The cover 512 remains coupled to the housing 510 during testing.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A high voltage diagnostic connector for a battery system comprising:

a housing holding a positive terminal, a negative terminal and a ground terminal forming part of a high voltage circuit of the battery system, the housing having a front and a rear, the positive terminal, the negative terminal and the ground terminal being accessed at the front for diagnostic testing of the high voltage circuit by a testing device;

a cover removably coupled to the housing at the front to restrict and allow access to the positive terminal, the negative terminal and the ground terminal;

a high voltage interlock (HVIL) assembly in the housing, the HVIL assembly having a first HVIL contact, a second HVIL contact and an HVIL shunt operable in a shunted position and an un-shunted position to close and open, respectively, an HVIL circuit of the battery system, the HVIL shunt electrically connecting the first and second HVIL contacts in the shunted position, the first and second HVIL contacts being electrically isolated in the un-shunted position; and an HVIL switch held by the housing, the HVIL switch including a shunt actuator movable between a primary position and a secondary position, the shunt actuator operably coupled to the HVIL shunt, wherein the shunt actuator positions the HVIL shunt in the un-shunted position to open the HVIL circuit when in the primary position and wherein the shunt actuator positions the HVIL shunt in the shunted position to close the HVIL circuit when in the secondary position;

wherein the shunt actuator is movable between the primary position and the secondary position when testing the positive terminal, the negative terminal and the ground terminal with the testing device during diagnostic testing of the high voltage diagnostic connector.

2. The high voltage diagnostic connector of claim 1, wherein the shunt actuator is automatically moved to the primary position when the cover is removed from the housing, the shunt actuator being manually movable from the primary position to the secondary position during diagnostic testing.

3. The high voltage diagnostic connector of claim 1, wherein the HVIL switch includes a biasing member operably coupled to the shunt actuator, the biasing member forcing the shunt actuator to the primary position.

4. The high voltage diagnostic connector of claim 1, wherein the shunt actuator is configured to be moved between the primary position and the second position when the cover is coupled to the housing and access to the positive terminal, the negative terminal and the ground terminal is restricted.

5. The high voltage diagnostic connector of claim 1, wherein the HVIL switch includes an HVIL switch actuator accessible at the front for manual actuation, the HVIL switch actuator being operably coupled to the shunt actuator for moving the shunt actuator between the primary position and the secondary position, the shunt actuator directly engaging the HVIL shunt to physically move the HVIL shunt between the shunted position and the un-shunted position.

6. The high voltage diagnostic connector of claim 1, wherein the cover includes a cover actuator accessible at an exterior of the cover, the cover actuator being operable coupled to the HVIL switch to move the HVIL switch from the exterior of the cover.

7. The high voltage diagnostic connector of claim 1, wherein the cover includes a cover actuator accessible at an exterior of the cover, the cover actuator being movable between an engaged position and a disengaged position, the cover actuator being operably coupled to the HVIL switch in the engaged position to move the shunt actuator to the secondary position, the cover actuator being disengaged from the HVIL switch in the disengaged position, the shunt actuator being positionable in the primary position when the cover actuator is in the disengaged position.

8. The high voltage diagnostic connector of claim 7, wherein the cover includes a lock-out device holding the cover actuator in the disengaged position until the lock-out device is manually moved from the cover.

9. The high voltage diagnostic connector of claim 1, wherein the housing includes a shield surrounding the positive terminal, the negative terminal and the ground terminal and providing electrical shielding for the positive terminal, the negative terminal and the ground terminal, the cover having a cover shield providing electrical shielding.

10. The high voltage diagnostic connector of claim 1, further comprising a seal between the housing and the cover.

11. The high voltage diagnostic connector of claim 1, wherein the housing includes a shell having a cavity and an inner housing received in the cavity, the inner housing holding the positive terminal, the negative terminal and the ground terminal.

12. The high voltage diagnostic connector of claim 1, further comprising a cable assembly having a positive cable, a negative cable and a ground cable, the positive cable being coupled to the positive terminal and extending from the rear of the housing, the negative cable being coupled to the negative terminal and extending from the rear of the housing, the ground cable being coupled to the ground terminal and extending from the rear of the housing, the positive cable, the negative cable and the ground cable being routed remote from the housing to a battery of the battery system such that the housing is positionable at an access point remote from the battery for diagnostic testing.

13. The high voltage diagnostic connector of claim 1, wherein the HVIL switch includes a terminal cover covering one of the positive terminal, the negative terminal or the ground terminal, the terminal cover being movably coupled to the housing and having a biasing member engaging the terminal cover and holding the terminal cover at an extended position, the terminal cover being movable to a retracted position during diagnostic testing, the terminal cover being operably coupled to the shunt actuator and moving the shunt actuator between the un-shunted position and the shunted position as the terminal cover moves from the extended position to the retracted position.

14. A high voltage diagnostic connector for a battery system comprising:
a housing holding a positive terminal, a negative terminal and a ground terminal forming part of a high voltage circuit of the battery system, the housing having a front and a rear, the positive terminal, the negative terminal and the ground terminal being accessed at the front for diagnostic testing of the high voltage circuit by a testing device;
a cover removably coupled to the housing at the front, the cover being positionable in a coupled position and an uncoupled position, the cover restricting access to the positive terminal, the negative terminal and the ground terminal when in the coupled position, the cover allowing access to the positive terminal, the negative terminal and the ground terminal when in the uncoupled position;
a high voltage interlock (HVIL) assembly in the housing, the HVIL assembly having a first HVIL contact, a second HVIL contact and an HVIL shunt operable in a shunted position and an un-shunted position to close and open, respectively, an HVIL circuit of the battery system, the HVIL shunt electrically connecting the first and second HVIL contacts in the shunted position, the first and second HVIL contacts being electrically isolated in the un-shunted position; and
an HVIL switch held by the housing, the HVIL switch including a shunt actuator movable between a primary position and a secondary position, the shunt actuator operably coupled to the HVIL shunt, wherein the shunt actuator positions the HVIL shunt in the un-shunted position to open the HVIL circuit when in the primary position and wherein the shunt actuator positions the HVIL shunt in the shunted position to close the HVIL circuit when in the secondary position;
wherein the shunt actuator is movable between the primary position and the secondary position when the cover is in the coupled position.

15. The high voltage diagnostic connector of claim 14, wherein the shunt actuator is movable between the primary position and the secondary position when testing the positive terminal, the negative terminal and the ground terminal with the testing device during diagnostic testing of the high voltage diagnostic connector.

16. The high voltage diagnostic connector of claim 14, wherein the shunt actuator is automatically moved to the primary position when the cover is removed from the housing, the shunt actuator being manually movable from the primary position to the secondary position during diagnostic testing.

17. The high voltage diagnostic connector of claim 14, wherein the HVIL switch includes a biasing member operably coupled to the shunt actuator, the biasing member forcing the shunt actuator to the primary position.

18. The high voltage diagnostic connector of claim 14, wherein the HVIL switch includes an HVIL switch actuator accessible at the front for manual actuation, the HVIL switch actuator being operably coupled to the shunt actuator for moving the shunt actuator between the primary position and the secondary position, the shunt actuator directly engaging the HVIL shunt to physically move the HVIL shunt between the shunted position and the un-shunted position.

19. The high voltage diagnostic connector of claim 14, wherein the cover includes a cover actuator accessible at an exterior of the cover, the cover actuator being operable coupled to the HVIL switch to move the HVIL switch from the exterior of the cover.

20. The high voltage diagnostic connector of claim 14, wherein the cover includes a cover actuator accessible at an exterior of the cover, the cover actuator being movable between an engaged position and a disengaged position, the cover actuator being operable coupled to the HVIL switch in the engaged position to move the shunt actuator to the secondary position, the cover actuator being disengaged from the HVIL switch in the disengaged position, the shunt actuator being positionable in the primary position when the cover actuator is in the disengaged position.

\* \* \* \* \*